US012765417B2

(12) United States Patent
Tey et al.

(10) Patent No.: US 12,765,417 B2
(45) Date of Patent: Oct. 13, 2026

(54) SEMICONDUCTOR PACKAGE WITH METAL POSTS FROM STRUCTURED LEADFRAME

(71) Applicant: Infineon Technologies AG, Neubiberg (DE)

(72) Inventors: Sock Chien Tey, Melaka (MY); Keck Tim Ang, Melaka (MY); Chan Lam Cha, Melaka (MY); Chau Fatt Chiang, Melaka (MY); Badrul Hisyam Ismail, Melaka (MY); Desmond Jenn Yong Loo, Melaka (MY); Ronizan Mohd Salleh, Johor (MY); Norliza Morban, Melaka (MY); Si Hao Vincent Yeo, Melaka (MY); Chee Mun Wai, Melaka (MY); Fee Hoon Wendy Wong, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 986 days.

(21) Appl. No.: 17/888,669

(22) Filed: Aug. 16, 2022

(65) Prior Publication Data

US 2023/0170329 A1 Jun. 1, 2023

Related U.S. Application Data

(63) Continuation-in-part of application No. 17/536,538, filed on Nov. 29, 2021, now Pat. No. 12,176,222.

(51) Int. Cl.
*H10W 90/00* (2026.01)
*H10W 20/20* (2026.01)
(Continued)

(52) U.S. Cl.
CPC ........... *H10W 90/00* (2026.01); *H10W 20/20* (2026.01); *H10W 20/484* (2026.01);
(Continued)

(58) Field of Classification Search
CPC ............... H01L 25/0657; H01L 21/568; H01L 23/3107; H01L 23/481; H01L 23/4824;
(Continued)

(56) References Cited

U.S. PATENT DOCUMENTS 6,563,209 B1 5/2003 Takahashi
9,269,595 B2 2/2016 Chi et al.
(Continued)

FOREIGN PATENT DOCUMENTS

DE 102021113069 A1 11/2021
DE 102020108851 B4 3/2023

OTHER PUBLICATIONS

Chiang, Chau Fatt, "Semiconductor Package with Lead Tip Inspection Feature", U.S. Appl. No. 16/882,008, filed May 22, 2020, 1-29.
(Continued)

*Primary Examiner* — Timor Karimy
(74) *Attorney, Agent, or Firm* — Murphy, Bilak & Homiller, PLLC

(57) ABSTRACT

A method of forming a semiconductor package includes providing a metal baseplate including a base section and a plurality of metal posts, the base section being a planar pad of substantially uniform thickness, the plurality of metal posts each extending up from a planar upper surface of the base section, mounting a semiconductor die on the upper surface of the metal baseplate, forming an encapsulant body of electrically insulating mold compound on the upper surface of the base section, electrically connecting terminals of the semiconductor die to the metal posts, and removing the base section so as to form package contacts from the metal posts at a first surface of the encapsulant body.

21 Claims, 28 Drawing Sheets

(51) Int. Cl.

| | |
|---|---|
| ***H10W 20/40*** | (2026.01) |
| ***H10W 70/60*** | (2026.01) |
| ***H10W 70/65*** | (2026.01) |
| ***H10W 74/01*** | (2026.01) |
| ***H10W 74/10*** | (2026.01) |

(52) U.S. Cl.

CPC .......... *H10W 70/611* (2026.01); *H10W 70/65* (2026.01); *H10W 74/019* (2026.01); *H10W 74/111* (2026.01); *H10W 90/725* (2026.01); *H10W 90/732* (2026.01)

(58) Field of Classification Search

CPC ..... H01L 23/5386; H01L 24/16; H01L 24/32; H01L 25/50; H01L 2224/16157; H01L 2224/32145; H10B 80/00; H10W 90/00; H10W 90/732; H10W 90/725; H10W 74/019; H10W 74/111; H10W 70/65; H10W 70/611; H10W 20/20; H10W 20/484

See application file for complete search history.

(56) References Cited

U.S. PATENT DOCUMENTS

| | | | | |
|---|---|---|---|---|
| 9,401,331 | B2 * | 7/2016 | Lin | H01L 23/5386 |
| 2002/0041012 | A1 | 4/2002 | Sakamoto et al. | |
| 2008/0211068 | A1 | 9/2008 | Chen et al. | |
| 2009/0236135 | A1 | 9/2009 | Ueda et al. | |
| 2009/0283884 | A1 | 11/2009 | Kang et al. | |
| 2010/0144101 | A1 * | 6/2010 | Chow | H01L 21/568<br>257/E21.502 |
| 2010/0244216 | A1 | 9/2010 | Huang et al. | |
| 2012/0086117 | A1 | 4/2012 | Chang et al. | |
| 2014/0070329 | A1 | 3/2014 | Flores et al. | |
| 2014/0124928 | A1 | 5/2014 | Lin et al. | |
| 2015/0187695 | A1 | 7/2015 | Yu et al. | |
| 2015/0279778 | A1 | 10/2015 | Camacho et al. | |
| 2016/0099201 | A1 | 4/2016 | Choi et al. | |
| 2017/0033036 | A1 | 2/2017 | Kajihara et al. | |
| 2017/0229436 | A1 | 8/2017 | Yu et al. | |
| 2017/0256509 | A1 | 9/2017 | Lee et al. | |
| 2018/0053713 | A1 | 2/2018 | Fontana | |
| 2018/0151521 | A1 | 5/2018 | Lee et al. | |
| 2019/0110361 | A1 | 4/2019 | Abe et al. | |
| 2020/0111765 | A1 * | 4/2020 | Kim | H01L 21/4853 |
| 2020/0185293 | A1 | 6/2020 | Schmalzl et al. | |
| 2020/0211934 | A1 | 7/2020 | Ko | |
| 2020/0350222 | A1 | 11/2020 | Danny Koh et al. | |
| 2020/0381380 | A1 * | 12/2020 | Lee | H01L 24/13 |

OTHER PUBLICATIONS

Saw, Khay Chwan, et al., “Chip to Chip Interconnect in Encapsulant of Molded Semiconductor Package”, U.S. Appl. No. 17/412,787, filed Aug. 26, 2021, 1-25.

* cited by examiner

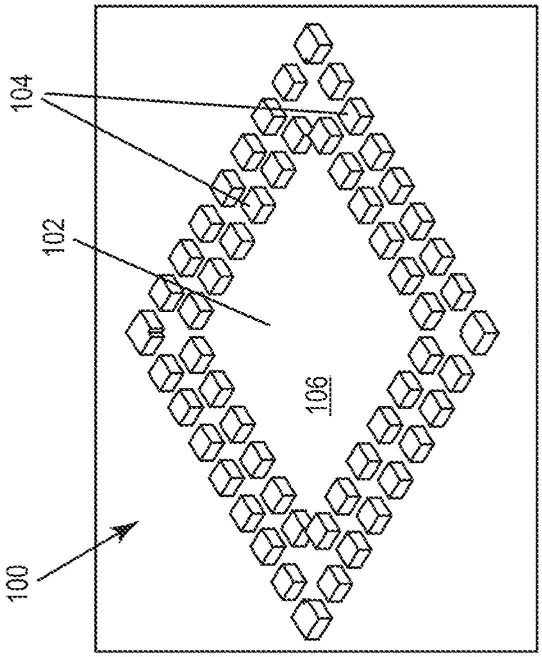
FIG. 1B
FIG. 1
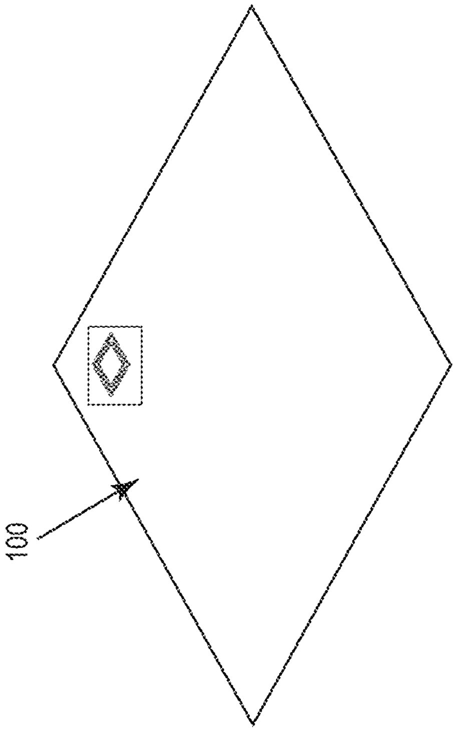
FIG. 1A

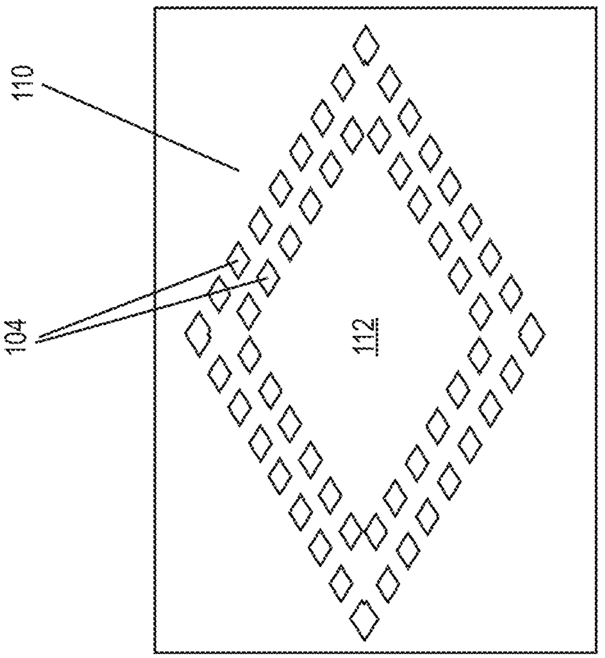
FIG. 1E
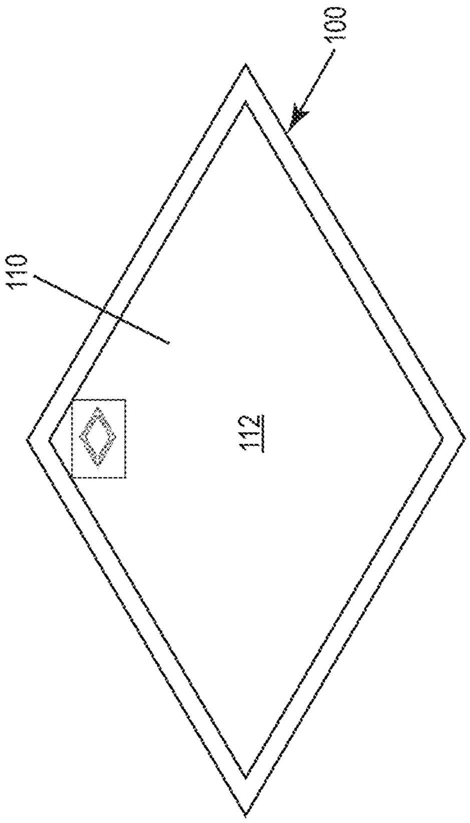
FIG. 1D
FIG. 1

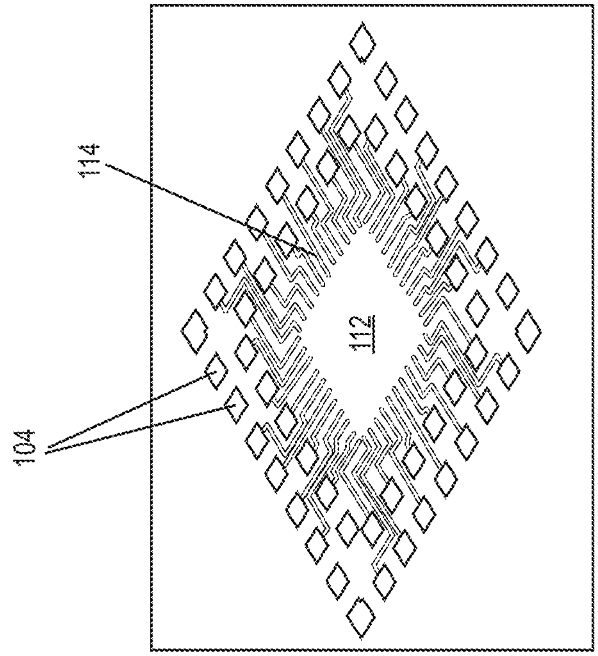
FIG. 1G
FIG. 1
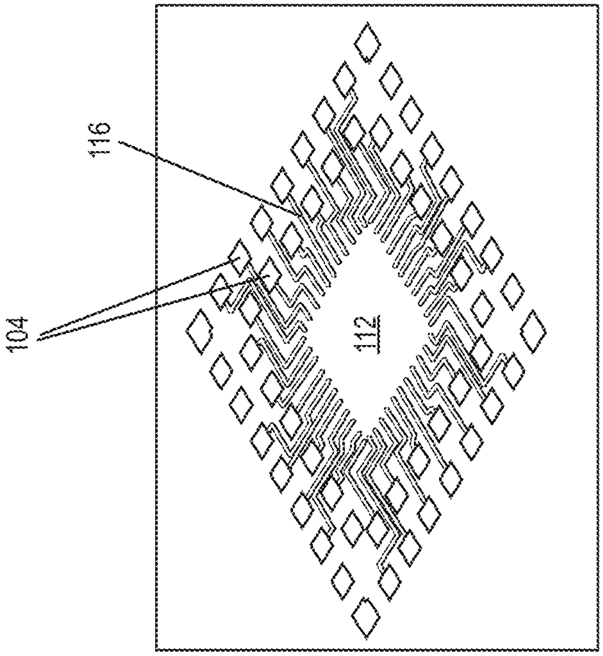
FIG. 1F

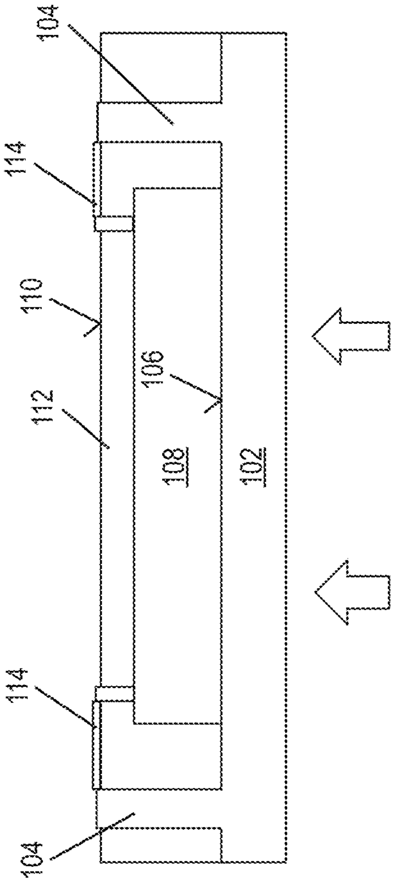
FIG. 1H
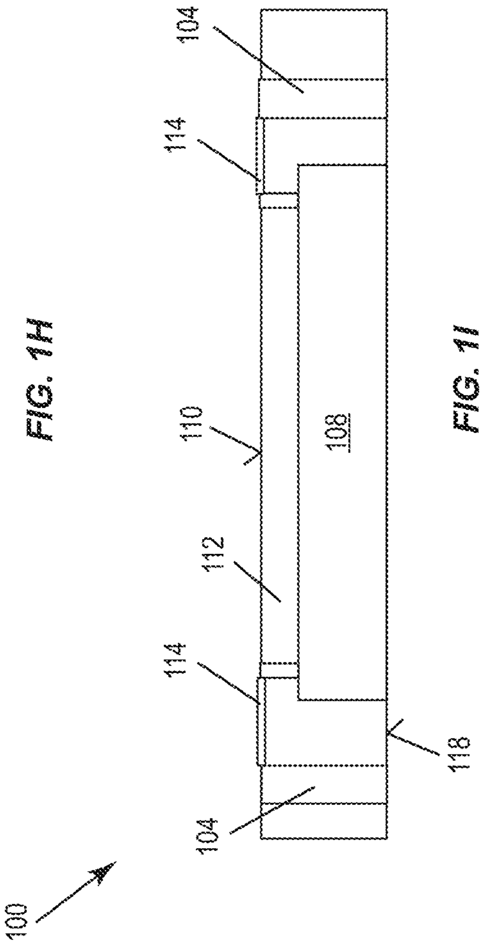
FIG. 1I
FIG. 1

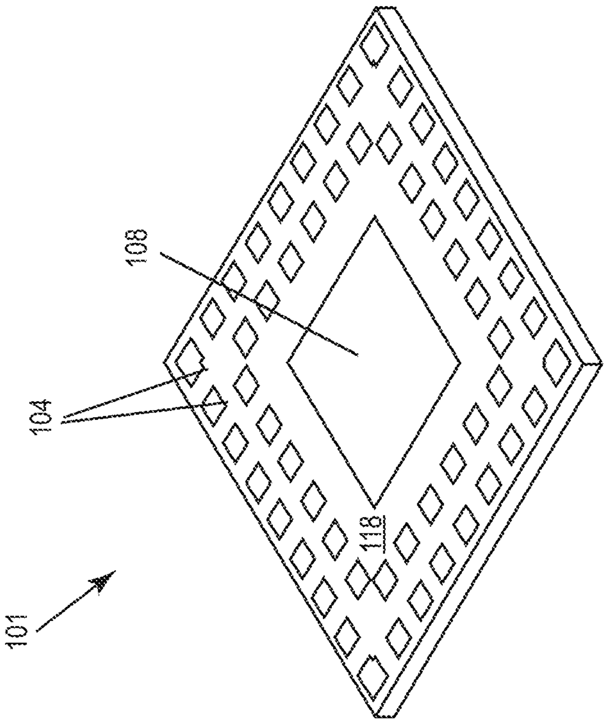
FIG. 2B
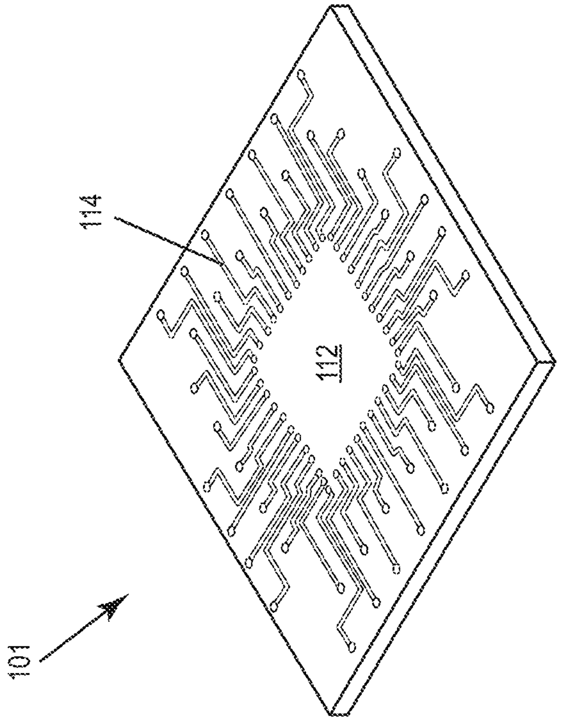
FIG. 2A
FIG. 2

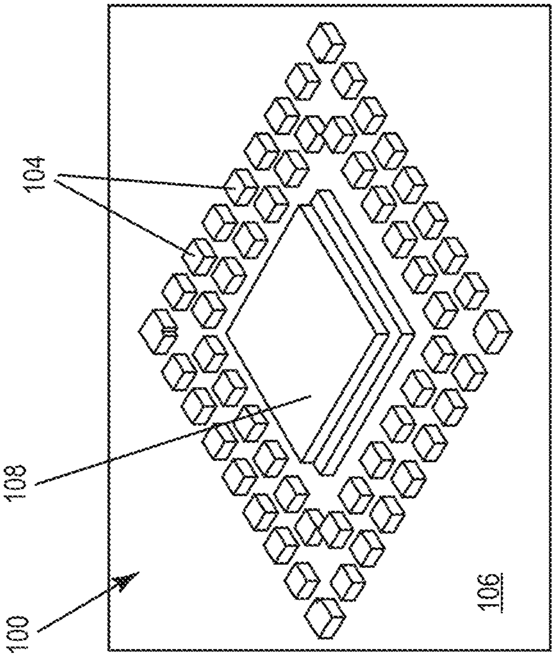
FIG. 4B
FIG. 4
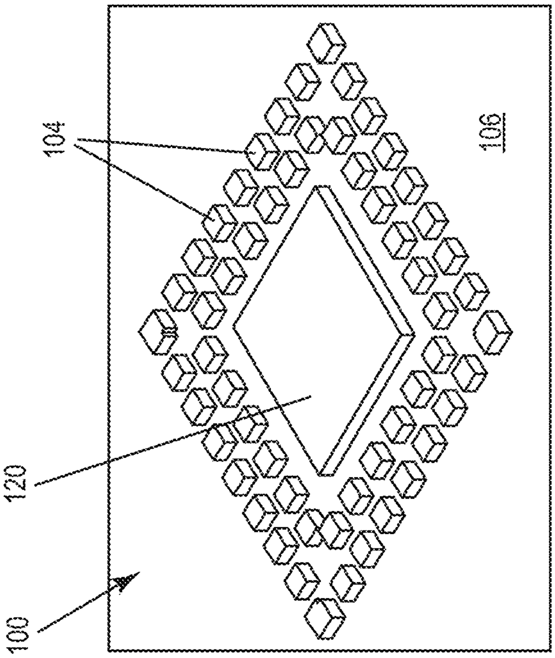
FIG. 4A

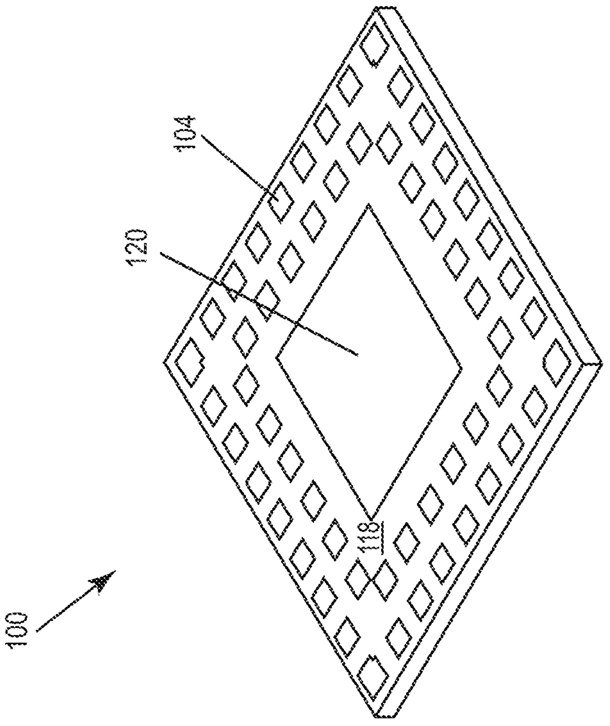
FIG. 5B
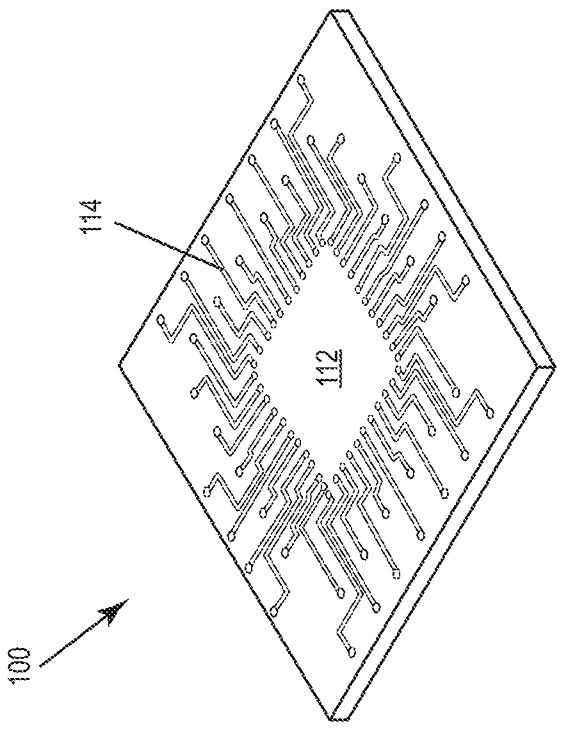
FIG. 5A
FIG. 5

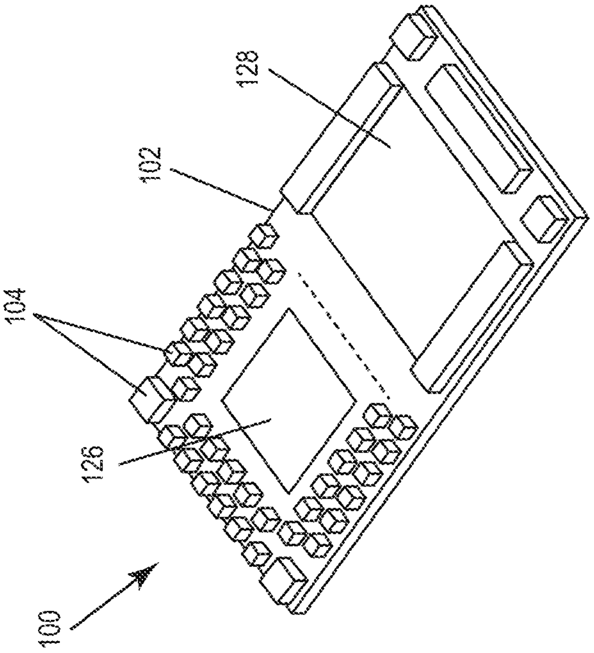
FIG. 6B
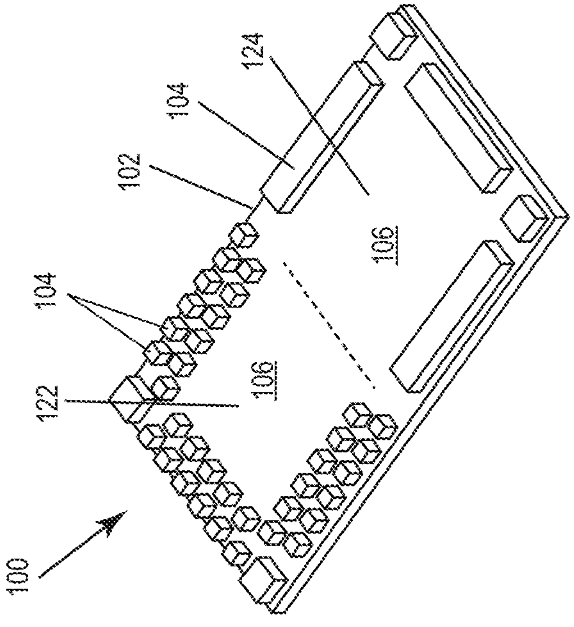
FIG. 6A
FIG. 6

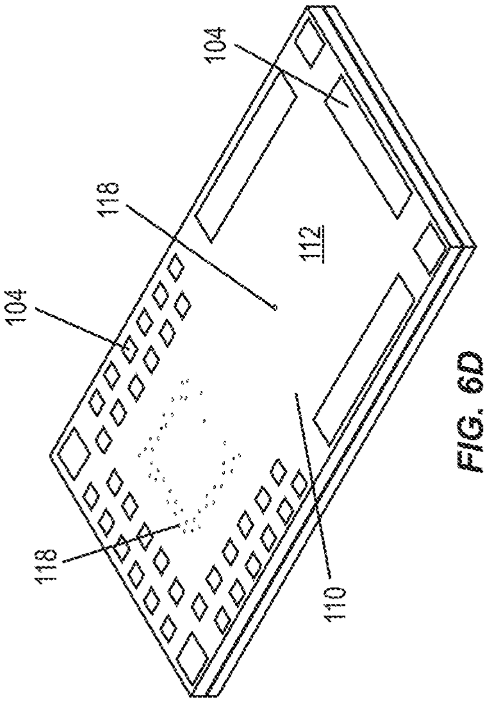
FIG. 6D
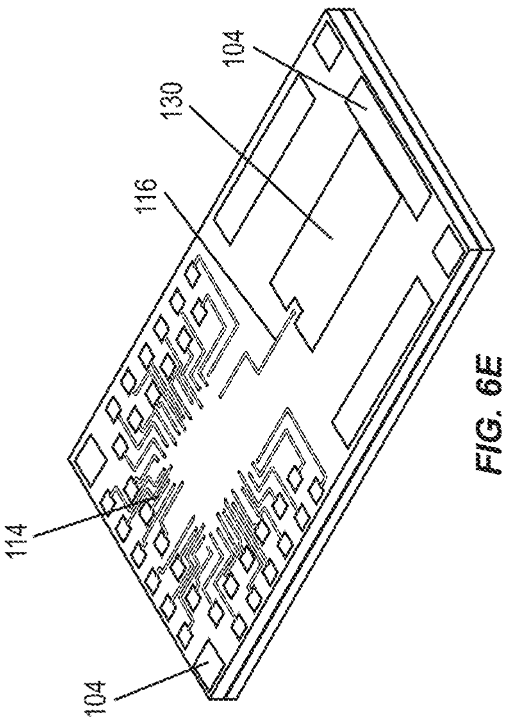
FIG. 6E
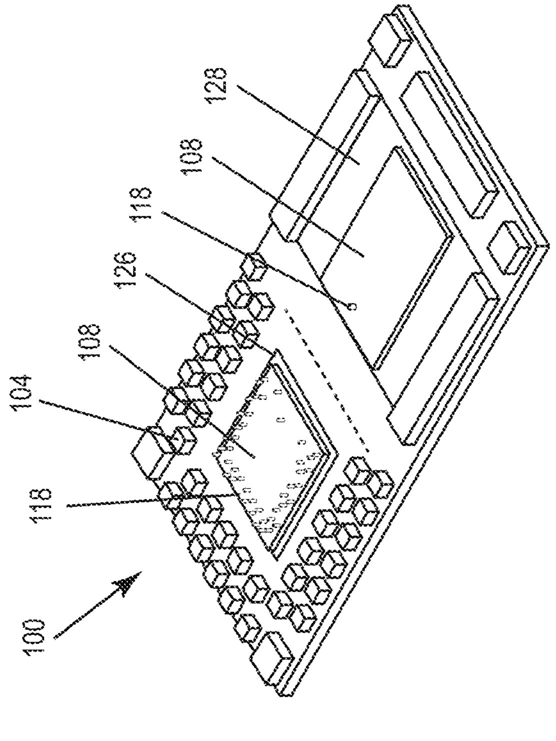
FIG. 6C
FIG. 6

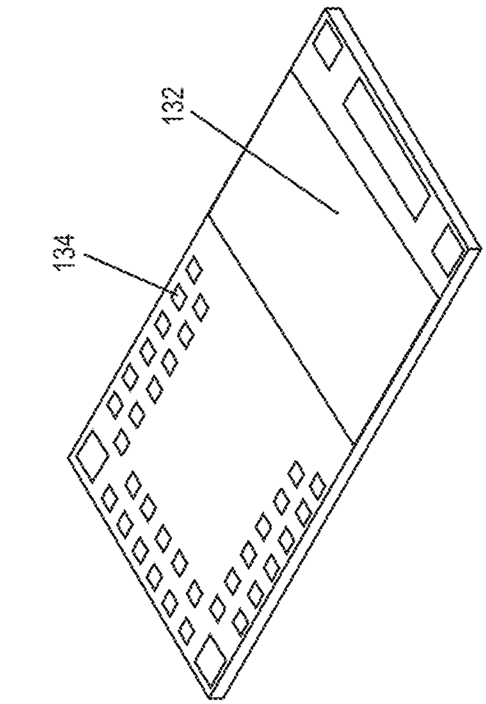
FIG. 6G
FIG. 6
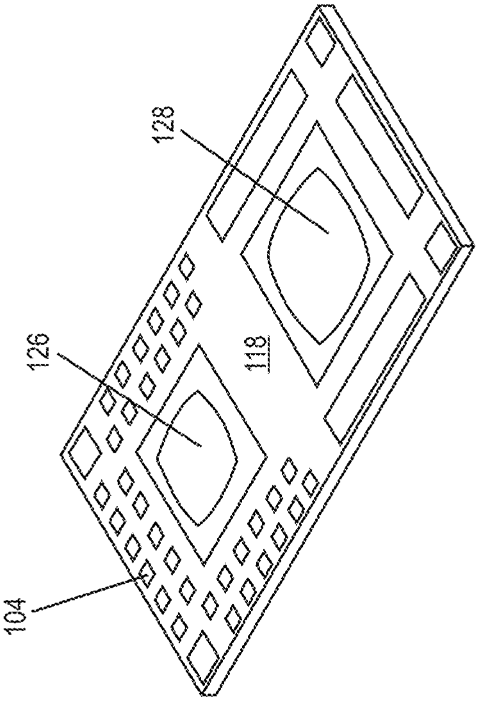
FIG. 6F

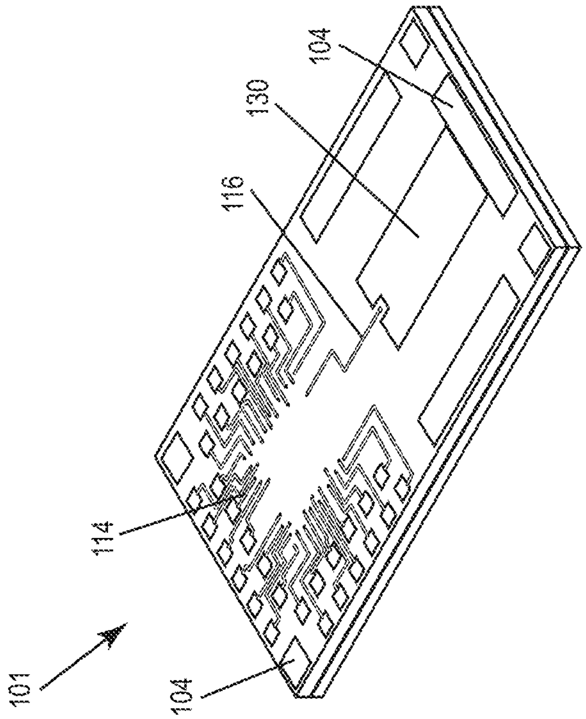
FIG. 7B
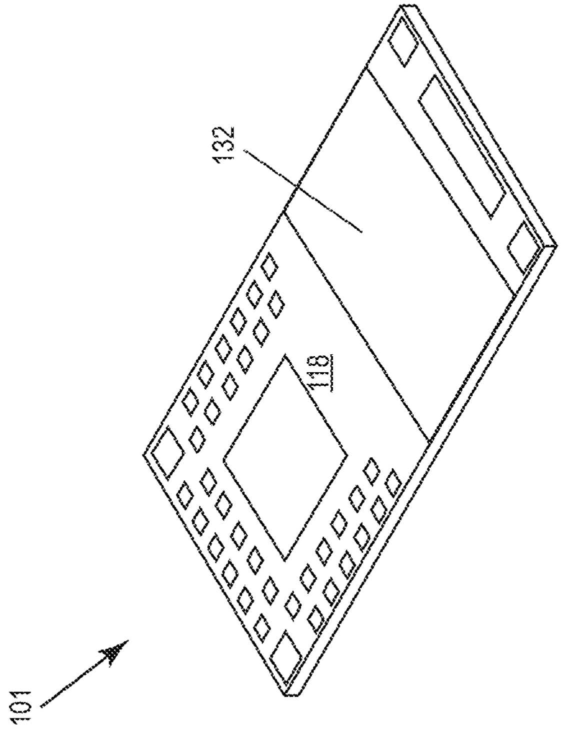
FIG. 7A
FIG. 7

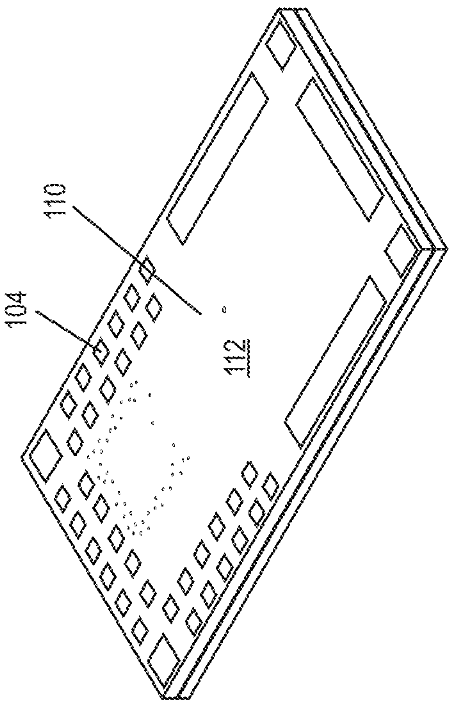
FIG. 9B
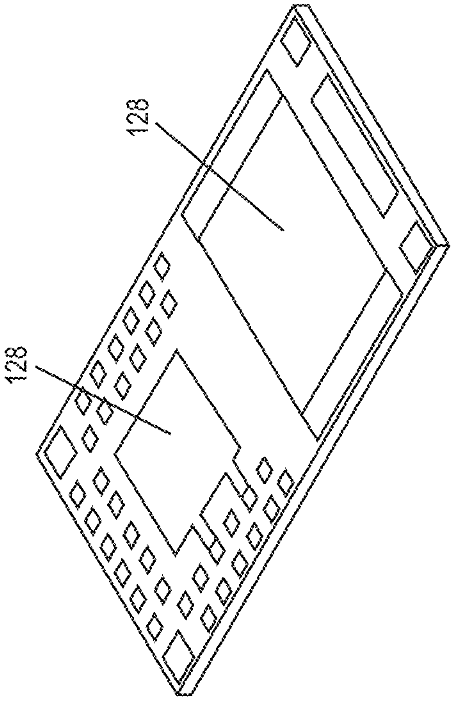
FIG. 9C
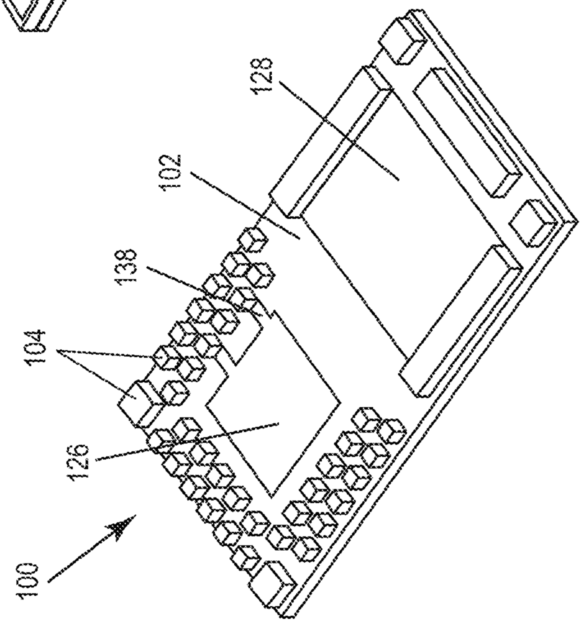
FIG. 9A
FIG. 9

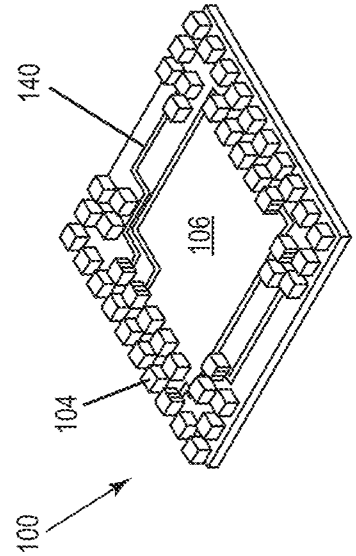
FIG. 10A
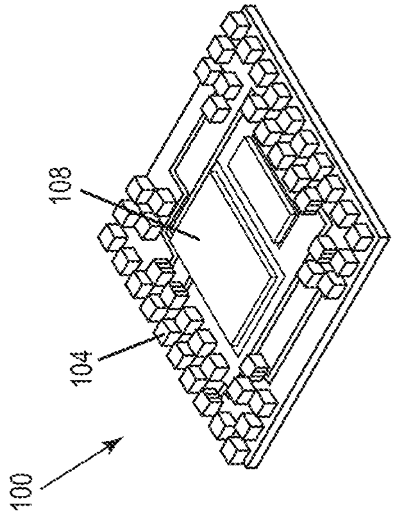
FIG. 10B
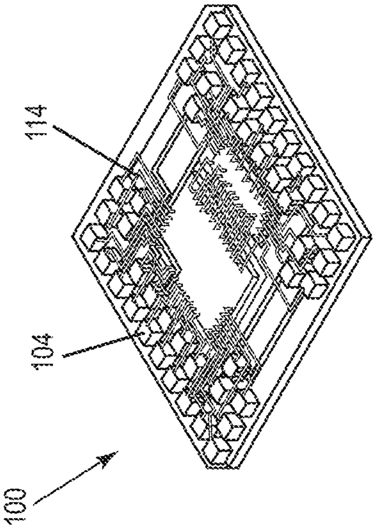
FIG. 10C
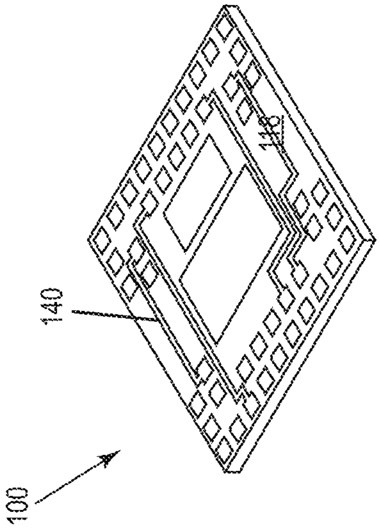
FIG. 10D
FIG. 10

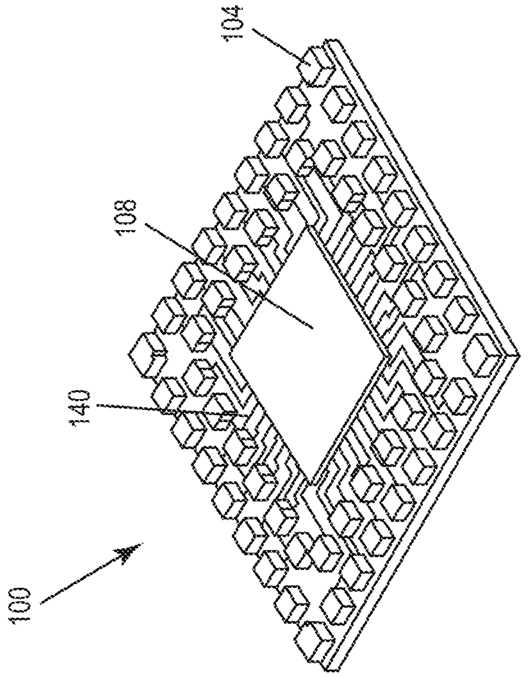
FIG. 11B
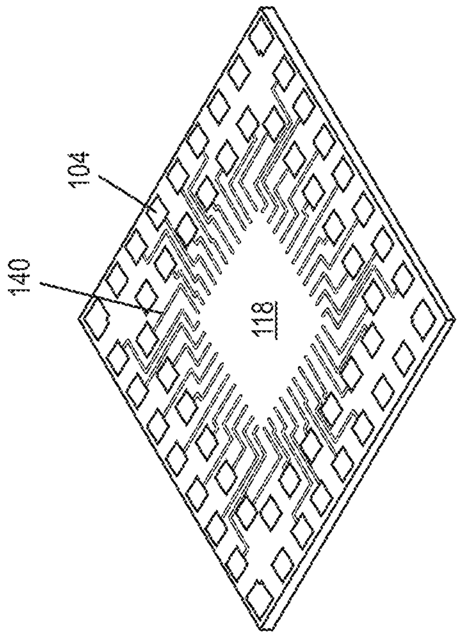
FIG. 11C
FIG. 11
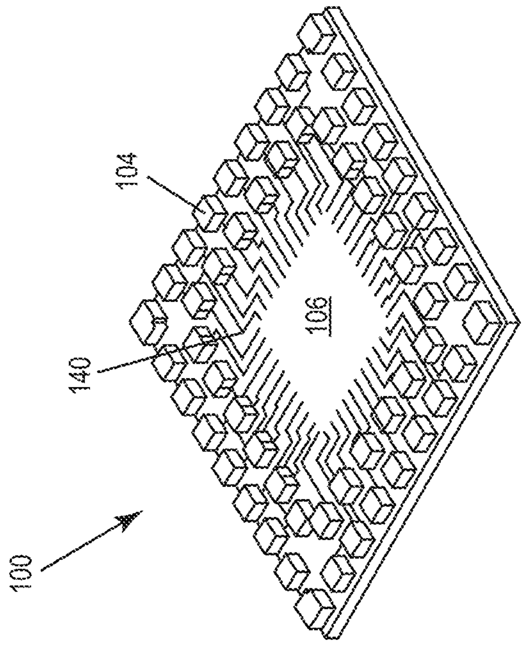
FIG. 11A

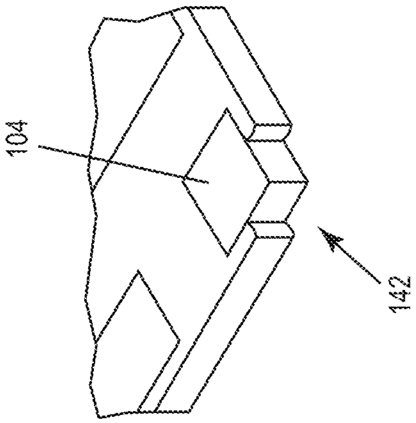
FIG. 12B
FIG. 12
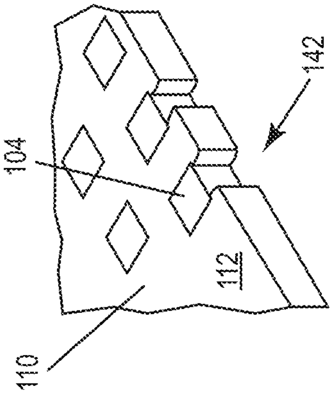
FIG. 12A

SEMICONDUCTOR PACKAGE WITH METAL POSTS FROM STRUCTURED LEADFRAME

TECHNICAL FIELD

The instant application relates to semiconductor devices, and in particular relates to methods of forming semiconductor packages and corresponding semiconductor packages.

BACKGROUND

Many types of semiconductor devices are highly sensitive to parasitic electrical effects such as parasitic interconnect resistance and inductance, parasitic capacitive coupling, etc. For example, switches, RF (radio frequency) power amplifiers, low-noise amplifiers (LNAs), antenna tuners, mixers, etc. are each highly sensitive to parasitic electrical effects. Techniques for reducing parasitic electrical effects on a packaged semiconductor device often result in higher overall cost, larger package size, more complex manufacturing process, reduced device performance, etc.

SUMMARY

A method of forming a semiconductor package is disclosed. According to an embodiment, the method comprises providing a metal baseplate comprising a base section and a plurality of metal posts, the base section being a planar pad of substantially uniform thickness, the plurality of metal posts each extending up from a planar upper surface of the base section, mounting a semiconductor die on the upper surface of the metal baseplate, forming an encapsulant body of electrically insulating mold compound on the upper surface of the base section, electrically connecting terminals of the semiconductor die to the metal posts, and removing the base section so as to form package contacts from the metal posts at a first surface of the encapsulant body.

Separately or in combination, the package contacts comprise ends of the ends of the metal posts that exposed at one or both of the first surface of the encapsulant body and a second surface of the encapsulant bod, the second surface being opposite from the first surface.

Separately or in combination, removing the base section comprises and one or more of: chemical etching, mechanical grinding, milling, or lasering.

Separately or in combination, the semiconductor die is mounted with at least some of the terminals facing away from the metal baseplate, and wherein electrically connecting terminals of the semiconductor die to the metal posts comprises providing conductive pillars on the terminals of the semiconductor die that face away from the base plate before forming the encapsulant body, exposing upper ends of the conductive pillars at a second surface of the encapsulant body after forming the encapsulant body; and forming conductive tracks in the second surface of the encapsulant body.

Separately or in combination, the method further comprises covering the conductive tracks with a solder resist material.

Separately or in combination, the electrically insulating mold compound comprises a laser-activatable mold compound, and wherein the forming conductive tracks comprises applying a laser to the second surface of the encapsulant body thereby forming a laser activated traces in the second surface of the encapsulant body, and performing a plating process that selectively forms the conductive tracks in the laser activated traces.

Separately or in combination, performing the plating process comprises performing an electroless plating process that forms seed layer parts of the conductive tracks, and performing an electroplating process that forms thicker metal layer parts of the conductive tracks on top of the seed layer parts, the thicker metal layer being thicker than the seed layer parts, and wherein the base section of the metal baseplate remains intact during the electroplating process.

Separately or in combination, forming conductive tracks comprises laser assisted metal deposition, or ink jet metal printing.

Separately or in combination, the method further comprises providing a first pad in a first area of the upper surface of the base section, providing second pad in a second area of the upper surface of the base section, the second pad comprising metal, mounting the semiconductor die on the first pad, and mounting a second semiconductor die on the second pad, wherein after removing the base section the metal pad is exposed from the first surface of the encapsulant body and forms a thermal conduction path between an outer surface of the semiconductor package and the second semiconductor die.

Separately or in combination, the first pad is an electrically insulating structure.

Separately or in combination, is an electrically conductive structure.

Separately or in combination, the semiconductor die is a logic device, the second semiconductor die is a power switching device, and the method further comprises electrically connecting a terminal of the semiconductor die to a terminal of the second semiconductor die.

Separately or in combination, the metal baseplate is provided to comprise a metal trace on the upper surface of the base section, and wherein the metal trace contacts the metal posts.

Separately or in combination, the metal baseplate is provided to comprise a die attach area on the upper surface of the metal baseplate, wherein the at least one metal trace extends between the die attach area and the metal posts, and wherein the semiconductor die is mounted on the die attach area such one of the terminals of the semiconductor die faces and electrically connects with the metal trace.

Separately or in combination, the metal trace is connected between a first one of the metal posts and a second one of the metal posts, wherein electrically connecting terminals of the semiconductor die to the metal posts comprise forming a conductive track in a second surface of the encapsulant body that is opposite from the first surface of the encapsulant body, and wherein the conductive track electrically connects one of the terminals of the semiconductor to the first one of the metal posts.

Separately or in combination, the method further comprises forming a lead tip inspection feature of the semiconductor package, wherein forming the lead tip inspection feature comprises structuring the encapsulant body to form an exposed sidewall of one of the metal posts, wherein the exposed sidewall extends completely between the first surface of the encapsulant body and a second surface of the encapsulant body that is opposite from the first surface.

Separately or in combination, forming the lead tip inspection feature further comprises structuring the encapsulant body form a second exposed sidewall of the one of the metal posts, wherein the second exposed sidewall extends completely between the first and second surfaces of the encapsulant body, and wherein the first and second exposed sidewalls form an angled intersection with one another.

Separately or in combination, the method further comprises providing a first pad that is electrically conductive on the upper surface of the base section, the first pad comprising a main pad portion and connectors that extend between the metal pad portion and at least one of the metal posts, and mounting the semiconductor die on the first pad such that at least one of the terminals of the semiconductor die faces and is electrically connected to the main pad portion.

Separately or in combination, forming the electrical interconnects comprises a metal structuring process that is performed after forming the encapsulant body.

According to another embodiment, the method comprises providing a metal baseplate comprising a base section and a plurality of metal posts, the base section being a planar pad of substantially uniform thickness, the plurality of metal posts each extending up from a planar upper surface of the base section, mounting a first semiconductor die on the upper surface of the base section in a flip chip arrangement, performing a first molding process to form a first encapsulant body of electrically insulating mold compound on the metal baseplate that encapsulates the first semiconductor die and comprises a first surface and a second surface opposite the first surface, removing the base section thereby detaching the metal posts from one another and exposing the metal posts at the first surface of the first encapsulant body, forming conductive tracks in the first surface of the first encapsulant body that electrically connect terminals of the first semiconductor die with the metal posts, mounting a second semiconductor die over the first surface or the second surface of the first encapsulant body, performing a second molding process to form a second encapsulant body of electrically insulating mold compound that encapsulates the second semiconductor die, and electrically connecting terminals of the second semiconductor die with the metal posts.

Separately or in combination, the second semiconductor die is mounted such that the second semiconductor die is centered relative to the first semiconductor die.

Separately or in combination, the second semiconductor die is mounted such that the second semiconductor die is off-center relative to the first semiconductor die.

Separately or in combination, the second semiconductor die is mounted over the first surface of the first encapsulant body.

Separately or in combination, the second semiconductor die is mounted in a flip chip arrangement, and wherein the method further comprises forming second conductive tracks in the first surface of the first encapsulant body, and mounting the second semiconductor die over the first surface of the first encapsulant body in a flip-chip arrangement such that the terminals of the second semiconductor die electrically connect with second conductive tracks, wherein the second conductive tracks electrically connect with one or both of the metal posts and the terminals of the first semiconductor die.

Separately or in combination, the second semiconductor die is mounted over the second surface of the first encapsulant body.

Separately or in combination, the second semiconductor die is mounted in a flip chip arrangement, and wherein electrically connecting the terminals of the second semiconductor die with the metal posts comprises forming conductive tracks in the second surface of the first encapsulant body that electrically connect the terminals of the second semiconductor die with the metal posts.

Separately or in combination, the second semiconductor die is mounted with the terminals of the second semiconductor die facing away from the second surface of the first encapsulant body, and wherein electrically connecting the terminals of the second semiconductor die with the metal posts comprises providing electrical interconnect elements between the terminals of the second semiconductor die and exposed ends of the metal posts before performing the second molding process.

Separately or in combination, the second semiconductor die is mounted with the terminals of the second semiconductor die facing away from the second surface of the first encapsulant body, and wherein electrically connecting the terminals of the second semiconductor die with the metal posts comprises forming conductive tracks in an outer surface of the second encapsulant body.

Separately or in combination, the metal posts surround a central region of the first encapsulant body, wherein the second encapsulant body is formed on a portion of the first encapsulant body that is within the central region of the first encapsulant body, and wherein the conductive tracks formed are formed along a side surface of the second encapsulant body that is tilted relative to the second surface of the first encapsulant body.

A semiconductor package is disclosed. According to an embodiment, the semiconductor package comprises an encapsulant body of electrically insulating mold compound comprising a first surface and a second surface opposite the first surface; a semiconductor die encapsulated within the encapsulant body; a plurality of metal posts encapsulated within the encapsulant body and spaced apart from one another; a plurality of contact pads that are electrically connected to the terminals of the semiconductor die and are disposed at a first side of the semiconductor package, wherein a main surface of the semiconductor die faces and is spaced apart from the first surface of the encapsulant body, wherein the main surface of the semiconductor die comprises terminals that are electrically connected to the contact pads.

Separately or in combination, the semiconductor package further comprises a layer of adhesive between the main surface of the semiconductor die and the first surface of the encapsulant body.

Separately or in combination, each of the metal posts comprise first ends that are covered by the mold compound and face the second surface of the encapsulant body.

Separately or in combination, a rear surface of the semiconductor die that is opposite from the main surface of the semiconductor die is exposed at the second surface of the encapsulant body.

Separately or in combination, a rear surface of the semiconductor die that is opposite from the main surface of the semiconductor die is spaced apart from the second surface of the encapsulant body and is covered by the mold compound.

Separately or in combination, the semiconductor package further comprises vertical connectors extending between the terminals of the semiconductor die and the first surface of the encapsulant body; and conductive tracks at the first surface of the encapsulant body that contact outer ends of the vertical connectors, and wherein the contact pads are electrically connected to the terminals of the semiconductor die by the conductive tracks.

Separately or in combination, the semiconductor package further comprises an electrically insulating layer at the first surface of the encapsulant body, wherein the electrically insulating layer covers the conductive tracks, and wherein the contact pads are exposed from the electrically insulating layer.

Separately or in combination, at least one of the contact pads overlaps with an end of the metal post.

Separately or in combination, at least one of the contact pads overlaps with one of the terminals of the semiconductor die.

According to another embodiment, the semiconductor package comprises a first encapsulant body of electrically insulating mold compound comprising a first surface and a second surface opposite the first surface, a first semiconductor die encapsulated within the first encapsulant body and comprising terminals that face the first surface of the encapsulant body, a plurality of metal posts encapsulated within the first encapsulant body and spaced apart from one another, conductive tracks formed in the first surface of the first encapsulant body that electrically connect the terminals of the first semiconductor die with the metal posts, a second encapsulant body of electrically insulating mold compound formed on the first surface or the second surface of the first encapsulant body, and a second semiconductor die encapsulated within the second encapsulant body, wherein terminals of the second semiconductor die are electrically connected with the metal posts.

Separately or in combination, the second semiconductor die is mounted such that the second semiconductor die is centered relative to the first semiconductor die.

Separately or in combination, the second semiconductor die is mounted such that the second semiconductor die is off-center relative to the first semiconductor die.

Separately or in combination, the second encapsulant body is formed on the first surface of the first encapsulant body.

Separately or in combination, the second semiconductor die is mounted in a flip chip arrangement, and wherein the conductive tracks formed in the first surface of the first encapsulant body electrically connect the terminals of the second semiconductor die with the metal posts.

Separately or in combination, the second encapsulant body is formed on the second surface of the first encapsulant body.

Separately or in combination, the second semiconductor die is mounted in a flip chip arrangement, and wherein the terminals of the second semiconductor die are electrically connected with the metal posts by conductive tracks formed in the second surface of the first encapsulant body that electrically connect the terminals of the second semiconductor die with the metal posts.

Separately or in combination, the second semiconductor die is mounted with the terminals of the second semiconductor die facing away from the second surface of the first encapsulant body, and wherein the terminals of the second semiconductor die are electrically connected with the metal posts by electrical interconnect elements that are encapsulated by the second encapsulant body.

Separately or in combination, the second semiconductor die is mounted with the terminals of the second semiconductor die facing away from the second surface of the first encapsulant body, and wherein the terminals of the second semiconductor die are electrically connected with the metal posts by conductive tracks formed in an outer surface of the second encapsulant body that electrically connect the terminals of the second semiconductor die with the metal posts.

Separately or in combination, the metal posts surround a central region of the first encapsulant body, wherein the second encapsulant body is formed on a portion of the first encapsulant body that is within the central region of the first encapsulant body, and wherein the conductive tracks formed are formed along a side surface of the second encapsulant body that tilted relative to the first surface of the first encapsulant body.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A-1I, illustrates selected steps in a method of forming a semiconductor package, according to an embodiment.

FIG. 2, which includes FIGS. 2A-2B, illustrates a semiconductor package, according to an embodiment. FIG. 2A depicts an isometric view of a second surface of the encapsulant body of the semiconductor package; and FIG. 2B depicts an isometric view of a first surface of the encapsulant body of the semiconductor package.

FIG. 3A depicts an isometric view of a second surface of the encapsulant body of the semiconductor package; and FIG. 3B depicts an isometric view of a first surface of the encapsulant body of the semiconductor package.

FIG. 4, which includes FIGS. 4A-4B, illustrates selected steps in a method of forming a semiconductor package, according to an embodiment.

FIG. 5, which includes FIGS. 5A-5B, illustrates a semiconductor package, according to an embodiment. FIG. 5A depicts an isometric view of a second surface of the encapsulant body of the semiconductor package; and FIG. 5B depicts an isometric view of a first surface of the encapsulant body of the semiconductor package.

FIG. 6, which includes FIGS. 6A-6G, illustrates selected steps in a method of forming a semiconductor package, according to an embodiment.

FIG. 7, which includes FIGS. 7A-7B, illustrates a semiconductor package, according to an embodiment. FIG. 7A depicts an isometric view of a first surface of the encapsulant body of the semiconductor package; and FIG. 7B depicts an isometric view of a second surface of the encapsulant body of the semiconductor package.

FIG. 9, which includes FIGS. 9A-9C, illustrates selected steps in a method of forming a semiconductor package, according to an embodiment.

FIG. 10, which includes FIGS. 10A-10D, illustrates selected steps in a method of forming a semiconductor package, according to an embodiment.

FIG. 11, which includes FIGS. 11A-1IC, illustrates selected steps in a method of forming a semiconductor package, according to an embodiment.

FIG. 12, which includes FIGS. 12A-12B, illustrates a lead tip inspection feature of a semiconductor package, according to an embodiment. FIG. 12A depicts a lead tip inspection feature disposed at one edge side of the semiconductor package; and FIG. 12B depicts a lead tip inspection feature disposed at an intersection between two edge sides of the semiconductor package.

FIGS. 14A-14B, illustrates embodiments of a semiconductor package that may be formed according to the method of FIG. 13.

FIGS. 15A-15F, illustrates selected steps in a method of forming a semiconductor package, according to an embodiment.

FIGS. 18A-18C, illustrates selected steps in a method of forming a semiconductor package, according to an embodiment.

DETAILED DESCRIPTION

Various embodiments of a method of forming a semiconductor package from a metal baseplate are described herein. The metal baseplate comprises a base section with a planar upper surface and a plurality of metal posts that project upward from the upper surface of the base section. One or more semiconductor dies are mounted on the upper surface of the base section. The semiconductor die or dies are encapsulated with an electrically insulating material, e.g., by a molding technique. Subsequently, the metal baseplate is removed, e.g., by etching, grinding, etc., until the metal posts are detached from one another and form discrete pillars extending between opposite facing surfaces of the encapsulant body. Before or after the molding process, the terminals of the semiconductor die or dies are electrically connected to the metal posts. According to one technique, the encapsulant material comprises a plateable mold compound and the connections between the terminals of the semiconductor die and the metal posts are at least partially formed by conductive tracks formed in the outer sides of the encapsulant body. Alternatively, these electrical connections may be formed by wire bonding. In any case the outer ends of the metal posts are exposed from a least one surface of the encapsulant body, and thus form externally accessible package contacts. In this way, a semiconductor package with an electrical redistribution connection that may extend outside of the footprint of the semiconductor die minimal parasitic electrical effects at low cost and small package footprint is advantageously provided. Separately or in combination, the metal posts can advantageously form lead tip inspection features with a large exposed metal area that is easily recognized by optical inspection equipment.

Figures 1, 1C:
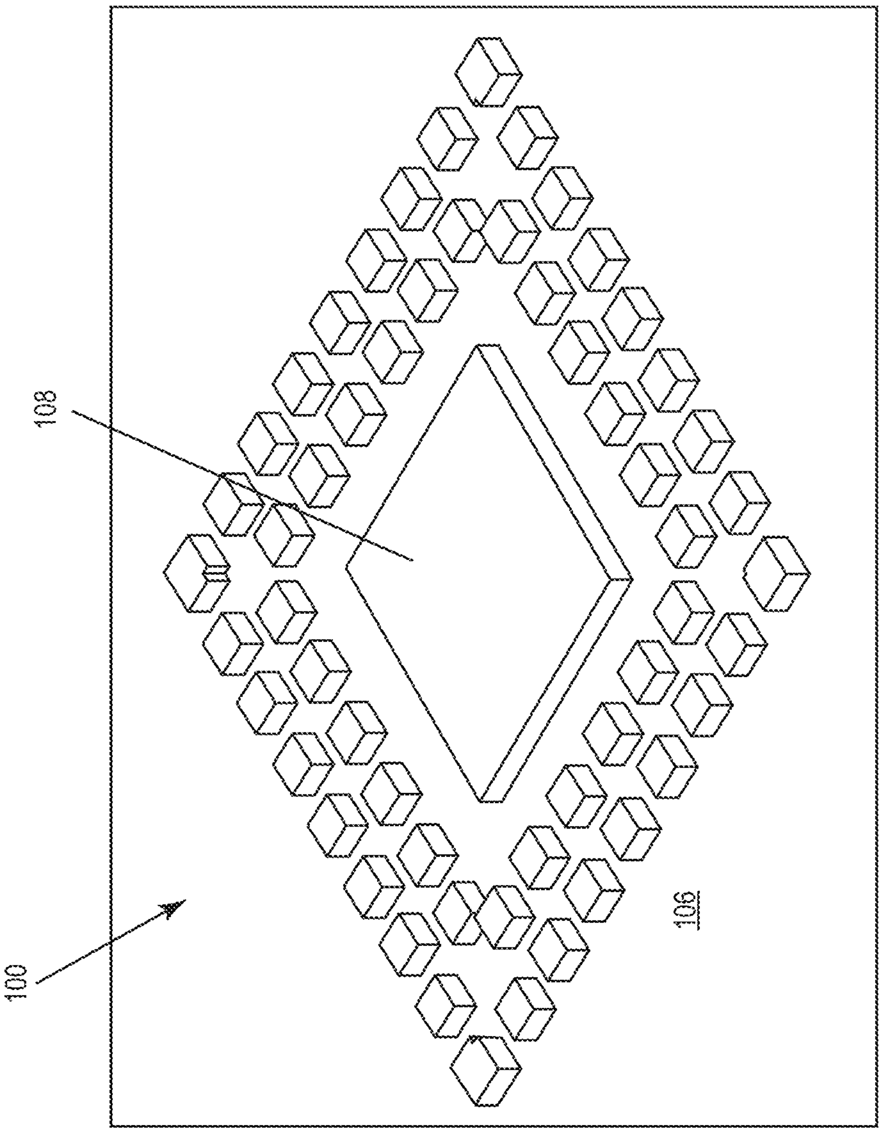

Referring to FIG. 1, a method of forming a semiconductor package 101 comprises providing a metal baseplate 100. The metal baseplate 100 comprises a base section 102 and plurality of metal posts 104. The base section 102 has a substantially uniform thickness, and each of the metal posts 104 project upward from a planar upper surface 106 of the base section 102. The metal posts 104 can have a variety of different geometries, e.g., cubic, cylindrical, etc. As shown in FIG. 1 B, the metal posts 104 can be formed to surround a die attach area on the upper surface 106 of the base section 102. The metal baseplate 100 comprising the base section 102 and plurality of metal posts 104 can be provided from a uniform thickness sheet of metal, e.g., as shown in FIG. 1A. This sheet of metal may comprise copper, aluminum, nickel, and alloys or combinations thereof. The structural features of the base section 102 and plurality of metal posts 104 can be created by performing any one or more metal processing techniques including, e.g., etching, grinding, stamping. According to one particular technique, a uniform thickness sheet of metal is provided, and the geometry of the base section 102 and the metal posts 104 is obtained by a half-etching technique, wherein the base section 102 corresponds to the half-etched region and the metal posts 104 correspond to the non-etched regions. FIG. 1A illustrates one package site comprising the metal posts 104 formed in a large metal sheet. The basic structure of the package site may be repeated multiple times in the large metal sheet, and the subsequent process steps to be described below can be performed in parallel so as to produce multiple semiconductor packages from a single sheet of metal.

Referring to FIG. 1C, a semiconductor die 108 is mounted on the upper surface 106 of the base section 102. An adhesive such as solder, sinter, glue or tape may be provided between a rear surface of the semiconductor die 108 and the upper surface 106 of the base section 102 so as to maintain the position of the semiconductor die 108. The rear surface of the semiconductor die 108 may comprise a device terminals, such as a source or drain terminal in the case of a vertical device.

Referring to FIG. 1 D, an encapsulant body 110 is formed on the upper surface 106 of the base section 102. The encapsulant body 110 can be formed by a molding process such as injection molding, transfer molding, compression molding, etc. As shown, the encapsulant body 110 can be formed on a single panel that comprises multiple package sites, so as to form the encapsulant body 110 for multiple ones of the semiconductor packages in parallel.

Generally speaking, the material of the encapsulant body 110 can include a wide variety of electrically insulating materials that are suitable for semiconductor packaging. Examples of these materials include mold compound, epoxy, thermosetting plastic, polymer, resin, fiber and glass woven fiber materials, etc. According to an embodiment, the encapsulant body 110 comprises a laser-activatable mold compound. A laser-activatable mold compound refers to a mold compound that includes metal particles, e.g., Cu, Ni, Ag, etc. These metal ions are released by a focused laser beam applied to the mold compound, which creates an active metal at the surface of the mold compound for a subsequent plating process, such as electroless plating or electroplating technique. In addition to the additive metal ions, a laser-activatable mold compound includes a polymer material as a base material. Examples of these polymers include thermoset polymers having a resin base, ABS (acrylonitrile butadiene styrene), PC/ABS (polycarbonate/acrylonitrile butadiene styrene), PC (polycarbonate), PA/PPA (polyimide/polyphthalamide), PBT (polybutylene terephthalate), COP (cyclic olefin polymer), PPE (polyphenyl ether), LCP (liquid-crystal polymer), PEI (polyethylenimine or polyaziridine), PEEK (polyether ether ketone), PPS (polyphenylene sulfide), etc.

As shown in FIG. 1E, ends of the metal posts 104 are exposed from a second surface 112 of the encapsulant body 110. This may be realized by initially over-molding the encapsulant body 110 over the metal posts 104 and subsequently removing encapsulant material, e.g., by chemical or mechanical methods, until the metal posts 104 are exposed.

Alternatively, the mold tool used to form the encapsulant body 110 may be geometrically configured to obtain this arrangement.

Referring to FIGS. 1F-G, a metal structuring process is performed after forming the encapsulant body 110 so as to form conductive tracks 114 in the second surface 112 of the encapsulant body 110. According to the depicted embodiment, a laser direct structuring technique is used to form the conductive tracks 114. According to this technique, as shown in FIG. 1 F, a laser is applied to the second surface 112 of the encapsulant body 110 at selected regions of the laser-activatable mold compound that extend to the exposed ends of the metal posts. The laser energy applied to the encapsulant body 110, which comprises a laser-activatable mold compound, creates laser activated traces 116 in the second surface 112 of the encapsulant body 110. The laser activated traces 116 comprise metal complexes that act as a nuclei for a metal plating process, such as an electroless or electroplating process. As shown in FIG. 1F a plating process is performed to selectively form the conductive tracks 114 in the location of the laser activated traces 116 without forming metal in adjacent locations of the second surface 112 of the encapsulant body 110.

Generally speaking, the plating process used to form the conductive tracks 114 can be any type of plating technique including electroless plating techniques and electroplating techniques. According to an embodiment, the plating process comprises a sequence of electroless plating followed by electroplating. Initially, an electroless plating process that forms seed layer parts of the conductive tracks is performed. According to this technique, the device is submerged in a chemical bath that contains metal ions (e.g., $Cu+$ ions, $Ni+$ ions, $Ag+$ ions, etc.) that react with the organic metal complexes in the laser activated traces 116, thereby forming a the seed layer part of the metal track 114 from the element from the chemical bath. Generally speaking, the thickness of the seed layer parts may be no greater than 2 μm, no greater than 1.5 μm, or no greater than 1.0 μm, e.g., between about 500 nm and 1.0 μm. Subsequently, an electroplating process is performed with the seed layer parts present. According to this technique, the device is again submerged in a chemical bath that contains metal ions (e.g., $Cu+$ ions, $Ni+$ ions, $Ag+$ ions, etc.) and the metal ions are reduced (deposited) onto the seed layer parts through application of an electrical current. Advantageously, the base section 104 of the metal baseplate 100 remains intact during the electroplating process. This allows for the base section 104 to provide a common cathode terminal that is connected to the seed layer parts via each of the metal posts 104, thus making the formation of the conductive tracks 114 on the encapsulant body 110 by electroplating possible. The electroplating process forms thicker metal layer parts of the conductive tracks 114 on top of the seed layer parts. Accordingly, the thicker metal layer parts formed by the electroplating together with the seed layer parts together form the conductive tracks 114, with the thicker metal layer parts being thicker than the seed layer parts. Generally speaking, the thickness of the seed layer parts may be at least 2 μm, at least 3 μm, or at least 5 μm, e.g., between about 5 μm and 10 μm. Conductive tracks 114 with these thickness values offer excellent electrical performance, including low electrical resistance and parasitic impact. By performing the sequence of electroless plating followed by electroplating, conductive tracks 114 with these advantageously high thickness values may be formed rapidly and inexpensively. In comparison to direct structuring techniques utilizing only electroless plating, the conductive tracks 114 can be formed much faster. In comparison to other interconnect techniques wherein a separate redistribution structure is formed, the plating process is less expensive, as no special tooling and fabrication lines are required to form the redistribution structure.

Instead of a laser a direct structuring technique, the conductive tracks 114 can be formed by other types of metal structuring process after forming the encapsulant body 100. For example, the conductive tracks 114 may be formed by a laser assisted metal deposition technique. According to this technique, a metal powder is applied to the second surface 112 of the encapsulant body 110 and a laser beam is used to fuse the metal power together into a metal track at the focal point of the laser beam. Separately or in combination, the conductive tracks 114 can be formed by an ink jet metal printing process. According to this technique, a viscous ink comprising a liquid solvent and a conductive metal, e.g., Ag, Cu, etc., is applied by a printer head in the desired location and subsequently dried. According to these techniques, the material of the encapsulant body 110 can be any type (not necessarily a laser-activatable mold compound) and the above described laser activation step can be omitted.

As shown in FIG. 1G, the conductive tracks 114 are formed to physically contact the exposed ends of the metal posts 104 and hence form an electrical connection with the metal posts 104. The conductive tracks 114 are routed over the location of the semiconductor die 108 and form electrical connections with upper surface terminals (not specifically shown in FIG. 1) of the semiconductor die 108 that face away from the metal baseplate. These electrical connections may be completed in a variety of different ways. According to one technique that is more particularly illustrated in FIGS. 6C-6D, conductive pillars 118 are formed on the terminals of the semiconductor die 108 that face away from the metal baseplate 100 before the encapsulation process. The conductive pillars 118 may comprise a metal such as copper, gold, aluminum, nickel, etc. and alloys thereof. Upper ends of these conductive pillars 118 are exposed at the second surface 112 of the encapsulant body 110, e.g., by mechanically or chemically removing the encapsulant material. The conductive tracks 114 may be formed to directly contact the outer ends of these conductive pillars 118, thus completing the electrical connection. A similar technique may be performed wherein metal stud bumps, e.g., Cu stud bumps are used instead of the conductive pillars 118. In yet another embodiment, openings are formed in the second surface 112 of the encapsulant body 110 so as to directly expose the upper surface terminals of the semiconductor die 108 that face away from the metal baseplate 100 from the encapsulant material. These openings may be formed as part of the lasering process that forms the laser activated traces 116. Subsequently, the plating process or processes which form the conductive tracks 114 may also form via structures in the openings, thus completing the electrical connection.

Referring to FIG. 1 H, the base section 102 of the metal baseplate 100 is removed. This may be done by a variety of techniques. Examples of these techniques include any one or combination of: chemical etching, mechanical grinding, milling, or lasering. In each case, material from the base section 102 is removed from a rear side of the device until the metal posts 104 are no longer connected to one another by the metal baseplate 100. While the figure shows the process being performed on a single package, this process may be performed on a single metal plate before singulating multiple package sites to form individual semiconductor packages 101 (e.g., by cutting, lasering, etc.).

As shown in FIG. 1I, the removal of the base section 102 exposes a first surface 118 of the encapsulant body 110 that is opposite from the second surface 112 of the encapsulant body 110. Outer ends of the metal posts 104 are exposed at this second surface 118 of the encapsulant body 110. Moreover, in the depicted embodiment, a rear side of the semiconductor die 108 is exposed at the first surface 118 of the encapsulant body 110. The outer ends of the metal posts 104 and the rear side of the semiconductor die 108 may be coplanar with the second surface 118 of the encapsulant body 110 as a result of a planarization process.

As a result of the process steps described with reference to FIGS. 1A-1I, a semiconductor package 101 is formed that comprises a semiconductor die 108 encapsulated within an encapsulant body 110, wherein the encapsulant body 110 comprises metal posts 104 that are electrically connected to the terminals of the semiconductor die 108 and extend between first and second surfaces 118, 112 of the encapsulant body 110. Package contacts of the semiconductor package 101 may be formed be ends of the metal posts 104 that are exposed from the encapsulant body 110. In principle, the package contacts may provided by the exposed ends of the metal posts 104 at the second surface 112, or the exposed ends of the metal posts 104 at the first surface 118, or both. Thus, the semiconductor package 101 may be configured such that either one of the first and second surfaces 118, 112 of the encapsulant body 110 forms a mounting surface that is capable of mounting and electrical connection to a carrier structure, such as a PCB. Further processing techniques in addition to the steps taken with reference to FIG. 1A may be performed to form additional layers of conductive or insulating material on the semiconductor package 101. For example, an electrically insulating region of, e.g., polymer, resin, epoxy, glass, etc., may be provided on one or both sides of the semiconductor package 101 so as to protect and electrically insulate any exposed conductive surface wherein electrical connection is not desired. In one particular example of this concept, a solder resist layer such as a lacquer, epoxy, liquid photoimageable solder mask, dry-film photoimageable solder mask, etc. is formed to cover the conductive tracks 114 and/or the exposed ends of the metal posts 104 at the second surface 112 of the encapsulant body 110 so as to electrically isolate these structures.

Separately or in combination, one or more application-specific coatings such as Ni, Au, Sn, Sn/Pb, Ag, Ag/Pd, etc., may also be applied to outer conductive surfaces including, e.g., the exposed ends of the metal posts 104 and/or the conductive tracks 118.

Referring to FIG. 2, one example of a semiconductor package 101 that may be formed according to the above described techniques is shown. The semiconductor package 101 is a so-called QFN (quad-flat-no-leads) package, wherein a side of the semiconductor package 101 comprising the exposed ends of the metal posts 108 at the first surface 118 of the encapsulant body 110 forms a mounting surface of the semiconductor package 101, and a side of the semiconductor package 101 comprising the conductive tracks 114 at the second surface 112 of the encapsulant body 110 forms a top side of the semiconductor package 104. Advantageously, the QFN package is realized with a very small package footprint, high integration density, and low cost.

Figures 3, 3A, 3B:
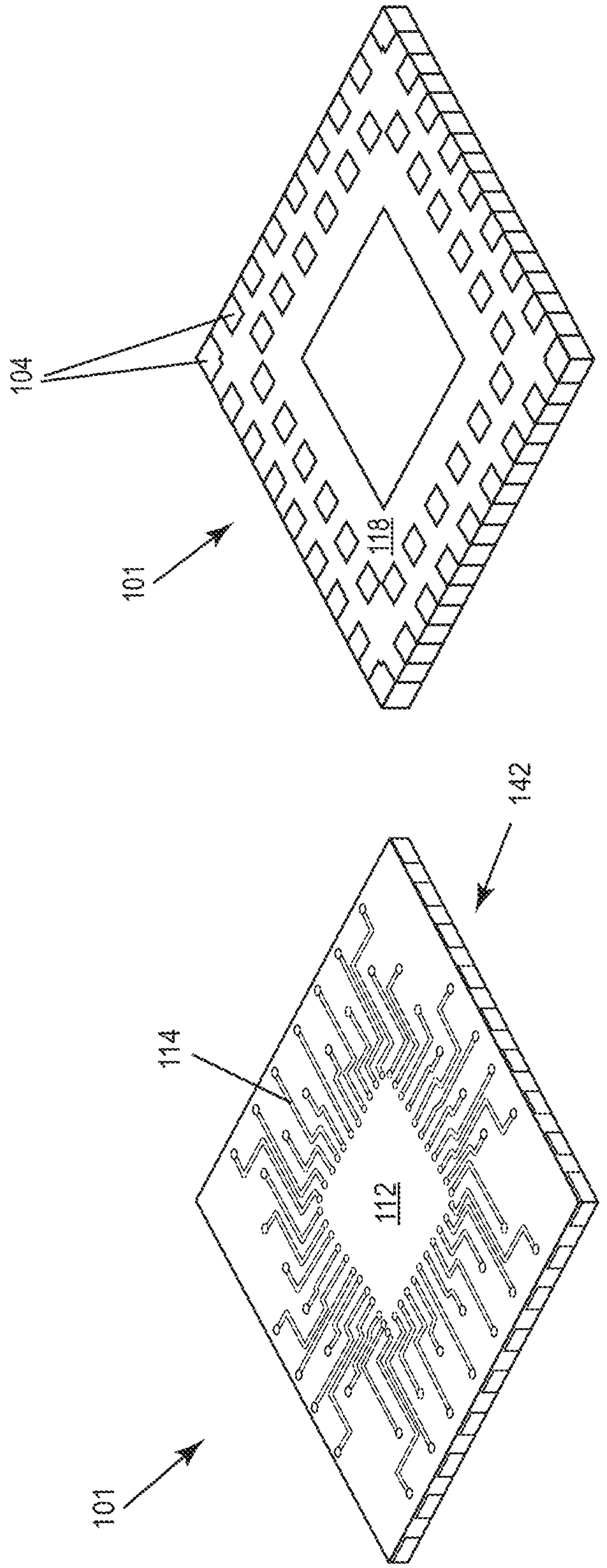
FIG. 3, which includes
FIGS. 3A-3B, illustrates a semiconductor package, according to an embodiment.

Referring to FIG. 3, another example of a semiconductor package 101 that may be formed according to the above described techniques is shown. The semiconductor package 101 is also a QFN package, and only differs from the semiconductor package 101 described with reference to FIG. 2 with respect to the configuration of the package contacts. In the semiconductor package 101 of FIG. 3, the encapsulant body 110 is formed such that the metal posts 104 form LTI (lead tip inspection) features 142. The LTI features 142 allow for optical inspection of a solder joint when the semiconductor package 101 is mounted and electrically connected to a carrier, such as a printed circuit board, and the package contacts of the semiconductor package 101 are soldered to the carrier. The LTI features 142 are formed by structuring the encapsulant body 110 to expose a sidewall of one of the metal posts 104 at an outer edge side of the encapsulant body 110. For example, the encapsulant material can be removed by etching, lasering, etc. after forming the encapsulant body 110 to expose the metal post. Alternatively, the mold cavity which forms the encapsulant body 110 can be configured so as to not cover the outer sidewalls of the metal posts 104 with encapsulant material during the encapsulation process. A specific discussion of potential geometric configurations for the LTI feature 142 is provided below with reference to FIG. 12.

Referring to FIG. 4, a method for forming the semiconductor package 101 is shown, according to another embodiment. In this case, the semiconductor package 101 is formed to comprise a metal die pad 120 that is thermally coupled to the semiconductor die 108. As shown in FIG. 4A, the metal baseplate 100 is provided to further comprise the die pad 120 located in a central region between the metal posts 104. The die pad 120 is a locally thicker part of the metal baseplate 100 that is elevated from the surrounding upper surface 106 of the base section 102. However, the die attach surface of the die pad 120 is below the outer ends of the metal posts 104 that are elevated from the upper surface 106 of the base section 102 so as to accommodate the thickness of the semiconductor die 108 in the completed semiconductor package 101. As shown in FIG. 4B, the semiconductor die 108 is mounted on the die pad 120 in a similar manner as previously described. Subsequently, the above described processing steps may be performed to complete the formation of the semiconductor package 101. When the baseplate 100 is removed, e.g., according to the process described with reference to FIG. 1H, the die pad 120 remains intact as part of the semiconductor package.

Referring to FIG. 5, one example of a semiconductor package 101 that is configured as a QFN package is shown. The semiconductor package 101 is identical to the semiconductor package 101 described with reference to FIG. 3, except it includes the metal die pad 120 that is thermally coupled to the semiconductor die 108. As shown in FIG. 5B, an outer surface of the die pad 120 is exposed at the first surface 118 of the encapsulant body 110. Thus, the mounting surface of the semiconductor package 101 may comprise the die pad 120, which may be preferred in certain applications for heat dissipation purposes.

Referring to FIG. 6, a method for forming a semiconductor package 101 that comprises two of the semiconductor dies 108 is depicted, according to an embodiment. As shown in FIG. 6A, the base section 102 of the metal baseplate 100 may be provided to comprise first and second die attach regions 122, 124 that are each dimensioned to accommodate the mounting of a semiconductor die 108 thereon. The configuration of the metal posts 104 (e.g., size, location) surrounding each of the first and second die attach regions 122, 124 may differ from one another so as to accommodate different I/O connectivity for a particular semiconductor die 108.

As shown in FIG. 6B, a first pad 126 is provided on the upper surface 106 of the metal baseplate 100 in the first die attach region 122 and a second pad 128 is provided on the upper surface 106 of the metal baseplate 100 in the second die attach region 124. Generally speaking, the first pad 126 and the second pad 128 can be electrically insulating or electrically conductive. For example, either one of the first and second pads 126, 128 may be an electrically insulating structure formed from, e.g. polymer, resin, epoxy, glass, etc. Alternatively, one or both of the first and second pads 126, 128 may be an electrically conductive structure formed from, e.g. copper, aluminum, nickel, etc., and alloys thereof. The first and second pads 126, 128 may be attached to the metal baseplate 100 by an adhesive, e.g., solder, glue, etc. In the case of a metal structure, the first and second pads 126, 128 may be formed by a metal deposition technique, e.g., plating, sputtering, etc. According to an embodiment, the first pad 126 is an electrically insulating structure and the second pad 128 is an electrically conductive structure. As shown, the second pad 128 may be formed to extend to the metal posts 104 adjacent to the second die attach region 128, thus forming a conductive connection thereto.

As shown in FIG. 6C, a first one of the semiconductor dies 108 is mounted on the first pad 126 and a second one of the semiconductor dies 108 is mounted on the second pad 128. Generally speaking, the semiconductor dies 108 may have any configuration. According to an embodiment, the first semiconductor die 108 that is mounted on the first pad 126 is a logic device and the second semiconductor die 108 that is mounted on the second pad 128 is a power device. More particularly, the second semiconductor die 108 that is mounted on the second pad 128 may be a power transistor, e.g., MOSFET IGBT, etc., that is rated to block voltages on the order of 100 V (volts), 600 V, 1200 V or more, and the first semiconductor die 108 that is mounted on the first pad 126 is a driver die that is configured to control a switching operation of the power transistor. Each of the semiconductor dies 108 comprise terminals that face away from the metal baseplate 100. In the case of the first semiconductor die 108 that is mounted on the first pad 126, these terminals may correspond to the I/O terminals, e.g., for a logic device. In the case of the second semiconductor die 108 that is mounted on the second pad 128, the terminals that face away from the metal baseplate 100 may correspond to a gate terminal and a load terminal, e.g., source, drain, collector, emitter, etc., e.g., for a power transistor. Meanwhile, a second load terminal of the second semiconductor die 108, e.g., the opposite one of the source, drain, collector, emitter, etc., may face and electrically connect with the second pad 128. Conductive pillars 118 are formed on the terminals of the semiconductor dies 108 that face away from the metal baseplate 100, e.g., in a similar manner as previously described. In other embodiments, both of the semiconductor dies 108 are power transistors, or both of the semiconductor dies 108 are logic devices, and the connection techniques described herein are used to form a package interconnection between the two.

As shown in FIG. 6D, the encapsulant body 110 is formed such that upper ends of the conductive pillars 118 and the metal posts 104 are exposed at a first side 112 of the encapsulant body 110, e.g., in a similar manner as previously described. In the case of the metal posts 104 that are covered by the second pad 128, the part of the second pad 128 covering the metal post 104 is exposed at the first side 112 of the encapsulant body 110.

Referring to FIG. 6E, a metal structuring process is performed after forming the encapsulant body 110 to form electrical interconnects. This metal structuring process comprises forming the conductive tracks 114 between the terminals of the first one of the semiconductor dies 108 and the metal posts 104, thereby forming I/O connections for the first one of the semiconductor dies 108, e.g., in the case of a logic device. One of the conductive tracks 114 forms a direct electrical connection between a terminal from the first one of the semiconductor dies 108 that is mounted on the first pad 126 and the second one of the semiconductor dies 108 that is mounted on the second pad 128. This connection may correspond to a gate control connection between an output terminal of the first one of the semiconductor dies 108 and a gate terminal of the second one of the semiconductor dies 108, for example. The conductive tracks 114 can be formed according to any of the previously described techniques, e.g., laser direct structuring, laser assisted metal deposition, ink jet metal printing. Additionally, a metal connection plate 130 may be formed over the second one of the semiconductor dies 108 that is mounted on the second pad 128. The metal connection plate 130 may contact a load terminal of the semiconductor dies 108, e.g., in the case of a power transistor die. The metal connection plate 130 can be a separate metal plate, e.g. a Cu plate, that is attached to the semiconductor die 108, e.g., by soldering before or after the encapsulation process. Alternatively, the metal connection plate 130 may be formed by the same techniques used to form the conductive tracks 114 as described above including laser direct structuring, inkjet metal printing or laser assisted metal deposition, for example. As shown, the metal connection plate 130 may be formed to contact at least one of the metal posts 104, thus forming an electrical connection thereto.

Referring to FIG. 6F, the base section 102 of the metal baseplate 100 is removed, e.g., according to any of the previously described techniques. As a result, rear sides of the first pad 126 and the second pad 128, along with ends of the metal posts 104, are exposed at the first side 118 of the encapsulant body 110.

Referring to FIG. 6G, further processing steps may be performed after removal of the base section 102. These further processing steps may comprise providing a cooling plate 132 over the exposed part of the second pad 128. The cooling plate 132 may comprise a thermally conductive material. For example, the cooling plate 132 can be a metal structure, e.g., Cu, Al, Ni, and alloys thereof, that is attached to the exposed part of the second pad 128 by a conductive adhesive, e.g., solder, glue, etc. In that case, the cooling plate 132 may be configured as a point of electrical contact to a rear surface terminal of the second semiconductor die 108. Alternatively, if electrical isolation is preferred, the cooling plate 132 can comprise a thermally conductive and electrically insulating material, such as a TIM (thermal interface material). Outside of the cooling plate 132, a solder resist material 134 may be formed over the exposed surfaces of the metal posts 104, thereby protecting and electrically isolating these structures at this side of the device.

Referring to FIG. 7, a completed semiconductor package 101 that is formed according to the method described with reference to FIG. 6 is shown. The side of the semiconductor package shown in FIG. 7A may correspond to a top side of the semiconductor package 101 that faces away from a carrier such as a PCB in a mounted arrangement. The cooling plate 132 can radiate operational heat into the ambient environment during operation. Optionally, a heat sink structure may be mounted on the cooling plate 132. Meanwhile, the side of the semiconductor package shown in FIG. 7B may correspond to a mounting surface of the semiconductor package 101, wherein outer ends of the metal posts 104 form the package contacts that interface with and electrically connect to the carrier. Thus, in a difference to the previously described embodiments, the side of the semiconductor package 101 comprising the conductive tracks 114 at the second surface 112 of the encapsulant body 118 forms a mounting surface of the semiconductor package 101. A solder resist material 114 may be applied over the conductive tracks 114 and/or over the metal connection plate 130 so as to electrically isolate these structures from the carrier structure, while leaving the outer ends of the metal posts 104 available for electrical contact.

Figures 8, 8A, 8B:
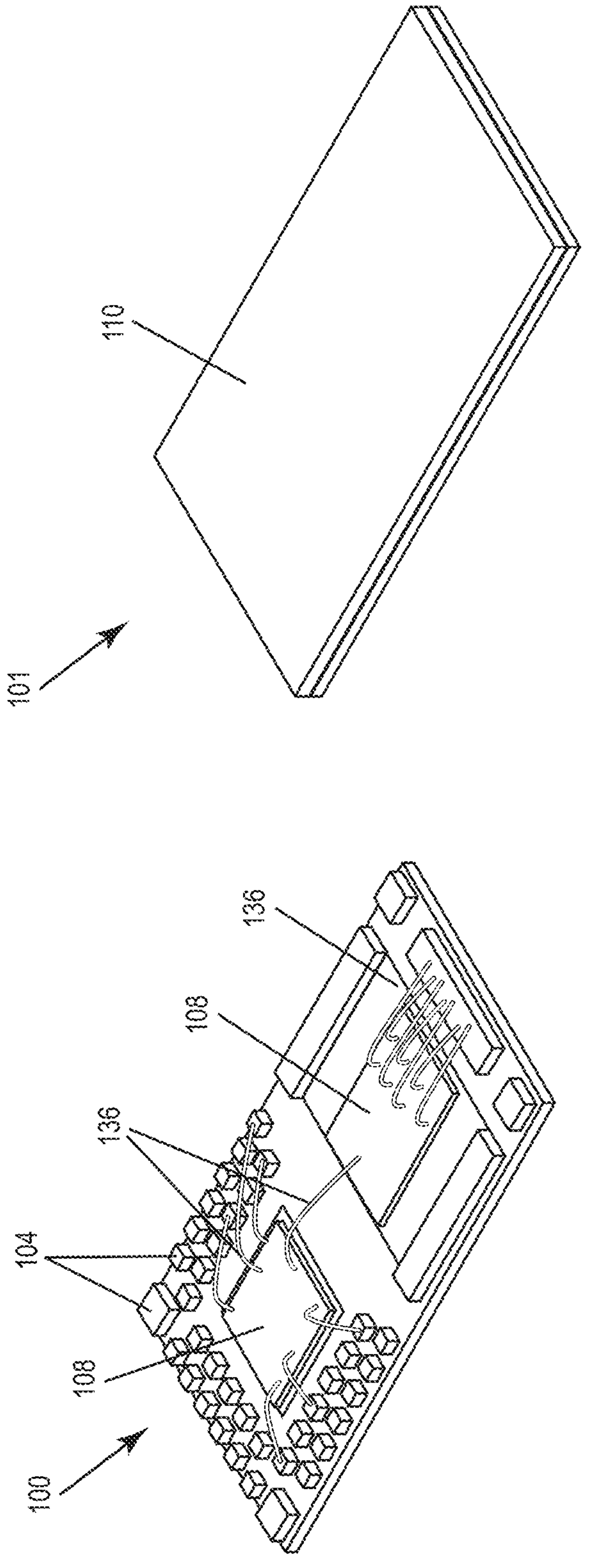
FIG. 8, which includes
FIGS. 8A-8B, illustrates selected steps in a method of forming a semiconductor package, according to an embodiment.

Referring to FIG. 8, a method for forming the semiconductor package 101 is shown, according to another embodiment. In this case, wire bonding is used instead of metal structuring on the encapsulant body 110. As shown in FIG. 8A, bond wires 136 are provided. These bond wires 136 connect the terminals semiconductor dies 108 to the metal posts 104 and connect the terminals of the semiconductor dies 108 to one another in a similar manner as previously described. As shown in FIG. 8B, after forming the bond wires 136, the encapsulation process is performed to form the encapsulant body 110. In this case, the encapsulant body 110 is formed to completely cover the bond wires 136 and the ends of the metal posts 104. The base section 102 of the baseplate may be removed to expose the ends of the metal posts 104 in a similar manner as previously described, thereby providing package contacts at the first side 118 of the encapsulant body 102.

Referring to FIG. 9, a method for forming the semiconductor package 101 is shown, according to another embodiment. In this case, a first pad 126 is used to form electrical interconnections to the metal posts. To this end, the first pad 126 electrically can be an electrically conductive structure. For example, the first pad 126 may be a metal structure comprising, e.g., Pd, Ag, Au, Ni, etc., and alloys thereof. As shown in FIG. 9A, the first pad 126 may be formed to comprise connectors 138 extending between a main pad portion of the first pad 126 and the metal posts 104. The semiconductor die 108 is mounted on the main pad portion of the first pad 126, and comprises a terminal that faces and electrically connects with the first pad 126. Thus, the lower surface terminal of the semiconductor die 108 is electrically connected to the metal posts 104 via connectors 138. As shown in FIG. 9B, after mounting of the semiconductor dies 108, the encapsulant body 110 can be formed in a similar manner as previously described. Conductive tracks 114 may be formed in a similar manner as previously described. As a result of the configuration of the first pad 126, the downward facing terminal of the semiconductor die 108 is electrically accessible via the exposed ends of the metal posts 104 at the second surface 112 of the encapsulant body 110. Meanwhile, as shown in FIG. 9C, the first and second pads 126, 128 may be used at the opposite side of the semiconductor package 101 as electrical terminals and/or cooling surfaces. The material composition of the first and second pads 126, 128 can be selectively etchable relative to the material composition of the base section 102. This allows for the base section 102 to be etched selectively relative to first and second pads 126, 128, thereby leaving the first and second pads 126, 128 intact after removal of the base section 102. For example, the first and second pads 126, 128 can comprise Pd, Ag, or Au in the case of a base section 102 that comprises Cu.

Referring to FIG. 10, a method for forming the semiconductor package 101 is shown, according to another embodiment. In this case, as shown in FIG. 10A, the metal baseplate 100 is provided to comprise at least one metal trace 140 on the upper surface 106 of the base section 100. The metal traces 140 are elevated from the planar upper surface 106 of the base section 102 and contact the metal posts 104. The metal traces 140 may comprise the same or different metal as the metal of the base section 102. For example, the metal traces 140 may be formed by performing an etch of the planar sheet of metal which forms the metal baseplate 100. Alternatively, the metal traces 140 may be formed by an additive technique, e.g., plating, sputtering, etc., wherein, e.g. copper, silver aluminum, nickel, etc. is deposited on the planar upper surface 106 of the base section 102. As shown in FIG. 10B, semiconductor dies 108 are mounted on a die attach region of the metal baseplate 100. As shown in FIG. 10C, terminals of the semiconductor dies 108 which face away from the metal baseplate 100 are electrically connected the metal posts 104 by forming conductive tracks 114 in the encapsulant body 110, e.g., in a similar manner as previously described. As shown in FIG. 10D, after removing the base section 102 from the metal baseplate 100, the metal traces 140 remain intact due to the fact that they are elevated from the planar upper surface 106 of the base section 102. Thus, the metal traces 140 form a second level of conductive tracks in the first surface 118 of the encapsulant body in addition to the conductive tracks 114 that are formed in the second surface 112 of the encapsulant body 110.

Referring to FIG. 11, a method for forming the semiconductor package 101 is shown, according to another embodiment. In this case, as shown in FIG. 11A, the metal baseplate 100 is provided to comprise the metal traces 140 on the upper surface 106 of the base section 100 and a die attach area on the upper surface of the metal baseplate 100 that is devoid of the metal traces 140. Further, the metal traces 140 are formed to extend between the between the die attach area and the metal posts 104. As shown in FIG. 11B, the semiconductor die 108 is mounted on the die attach area such that the terminals of the semiconductor die 108 face and electrically connect with metal traces 140 that extend directly underneath the semiconductor die 108. For example, the semiconductor die 108 may have a flip-chip configuration, wherein each of the metal traces 140 are connected to the respective terminals of the semiconductor die 108 by solder joints, for example. As shown in FIGS. 11C, after the base section 102 is removed, the metal traces 140 that remain intact form the necessary electrical interconnect between the terminals of the semiconductor die 108 and the metal posts 104. Thus, according to this concept, an interconnect level is provided at the first surface 118 of the encapsulant body 110 and the conductive tracks 114 at the second surface 112 of the encapsulant body 110 may be omitted. Alternatively, a further interconnect layer may be provided at the second surface 112 of the encapsulant body 110 according to the previously described techniques.

Referring to FIG. 12, any of the semiconductor packages 101 described herein may be formed to comprise an LTI (lead tip inspection) feature 142. As shown in each of FIGS. 12A and 12B, the exposed sidewall of the metal posts 104 can extend completely between the first surface 118 of the encapsulant body 110 and the second surface 112 of the encapsulant body 110 that is opposite from the first surface 118. Separately or in combination, a complete width of the metal post 108 may be exposed at the outer edge side of the encapsulant body 110. In this way, a large area is available for inspection of soldered joints. As is particularly shown in FIG. 12B, the encapsulant body 110 may be structured so that a second exposed sidewall from the one of the metal posts 104 is exposed, wherein the second exposed sidewall extends completely between the first surface 118 of the encapsulant body 110 and the second surface 112 of the encapsulant body 110 and forms an angled intersection with the first sidewall. In this way, lead tip inspection may be further enhanced, as a recognizable corner is exposed from the encapsulant body 110.

Figures 13, 13A, 13B, 13C:
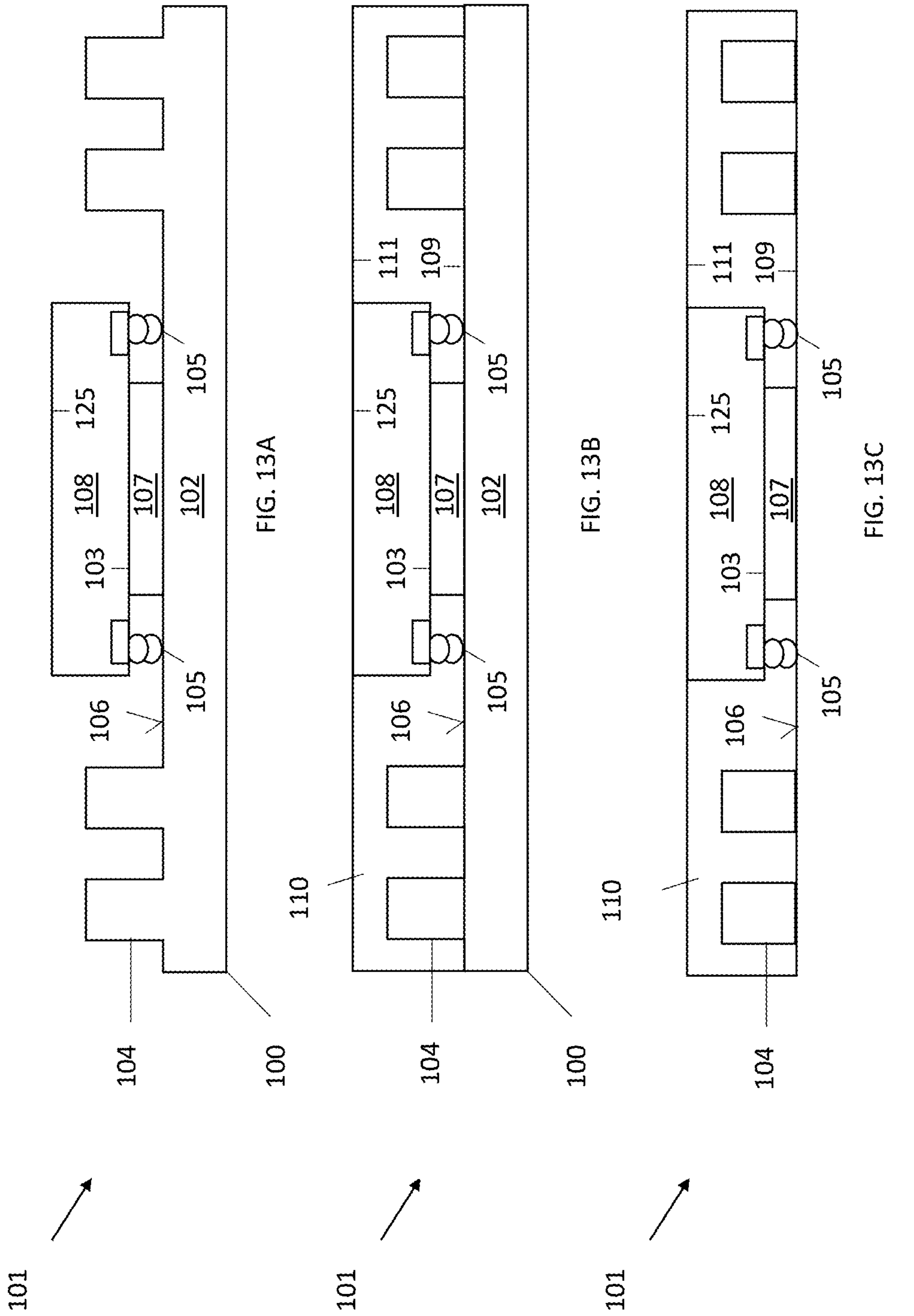
FIG. 13, which includes
FIGS. 13A-13F, illustrates selected steps in a method of forming a semiconductor package, according to an embodiment.

Referring to FIG. 13, a method for forming the semiconductor package 101 is shown, according to another embodiment. The method of FIG. 13 may be used for a metal baseplate 100 wherein the thickness of the semiconductor die 108 exceeds the height of the metal posts 104 from the metal baseplate 100. In some cases, it may be difficult or expensive to form features in a metal structure excess of a certain depth. For example, the height of the metal posts 104 may be no greater than 250 μm, no greater than 200 μm, no greater than 150 μm due to practical limitations such as etching time, capability, etc. The method of FIG. 13 represents one way to accommodate a semiconductor die 108 that is either thicker than the height of each of the metal posts 104 and/or extends pads a plane of the metal posts 104 when mounted.

Referring to FIG. 13A, the metal baseplate 100 comprising the base section 102 and a plurality of metal posts 104 is provided. Subsequently, a semiconductor die 108 is mounted on the upper surface 106 of the base section 102. In this case, the semiconductor die 108 is mounted in a flip chip arrangement wherein a main surface 103 of the semiconductor die 108 that comprises terminals faces the metal baseplate 100. The semiconductor die 108 is mounted with vertical connectors 105 extending between the terminals of the semiconductor die 108 and the upper surface 106 of the base section 102. The vertical connectors 105 can be soler balls, pillars, studs, etc. The vertical connectors 105 can be similar or identical to the conductive pillars 118 described herein. According to one embodiment, the vertical connectors 105 are solder balls that are provided with the semiconductor die 108 as a flip-chip device. According to another embodiment, the vertical connectors 105 are provided on the upper surface 106 of the base section 102 prior to mounting the semiconductor die 108 and the semiconductor die 108 can be subsequently arranged thereon.

According to an embodiment, the semiconductor die 108 is mounted with a layer of adhesive 107 between the main surface 103 of the semiconductor die 108 and the upper surface 106 of the base section 102. The layer of adhesive 107 can be used to stabilize the semiconductor die 108 and to provide a consistent vertical offset between the main surface 103 of the semiconductor die 108 and the upper surface 106 of the base section 102. The layer of adhesive 107 can be an electrically conductive adhesive, such as a solder paste or sinter paste. Alternatively, the layer of adhesive 107 can be electrically insulating, such as a glue.

According to an embodiment, a thickness of the semiconductor die 108 exceeds a height of the metal posts 104. The thickness of the semiconductor die 108 refers to a shortest distance between the rear surface 125 of the semiconductor die 108 that faces the metal baseplate 100 and the main surface 103 of the semiconductor die 108. The height of the metal posts 104 refers to a distance between the upper surface 106 of the metal baseplate 100 and first ends of the of the metal posts 104 that face away from the metal baseplate 100. The thickness of the semiconductor die 108 may be between 200 μm and 500 μm, or more particularly between 300 μm and 400 μm, or more particularly between 225 μm and 275 μm. The height of the metal posts 104 may between 100 μm and 300 μm, or more particularly between 150 μm and 250 μm, or more particularly between 175 μm and 225 μm. In an embodiment, the thickness of the semiconductor die is at least 250 μm and the height of the metal posts is no greater than 200 μm. Separately or in combination, when the semiconductor die 108 is mounted on the metal baseplate 100, the rear surface 125 of the semiconductor die 108 may be disposed further away from the upper surface 106 of the metal baseplate 100 than the first ends of the of the metal posts 104 that face away from the metal baseplate 100. This may result from the thickness of the semiconductor die 108 being greater than the height of the metal posts 104 and/or the additional vertical offset provided by the vertical connectors 105 and the layer of adhesive 107.

Referring to FIG. 13B, the encapsulant body 110 of electrically insulating mold compound is formed on the metal baseplate 100. The encapsulant body 110 can be formed according to any of the techniques described herein. The encapsulant body 110 is formed to comprise a first surface 109 that is coextensive with the planar upper surface 106 of the baseplate and a second surface 111 that is opposite from the first surface 109. According to an embodiment, the encapsulant body 110 is formed such that first ends of the metal posts 104 that face away from the upper surface 106 of the baseplate are covered by the mold compound and face the second surface 111 of the encapsulant body 110. That is, the encapsulant body 110 is formed with a thickness of mold material between the first ends of the metal posts 104 and the second surface 111 of the encapsulant body 110. According to an embodiment, the encapsulant body 110 is formed such that the rear surface 125 of the semiconductor die 108 is exposed at the second surface 111. As shown, the rear surface 125 of the semiconductor die 108 is coplanar with the second surface 111 of the encapsulant body 110. In other embodiments, the rear surface 125 of the semiconductor die 108 may protrude past the second surface 111 of the encapsulant body 110.

Referring to FIG. 13C, the base section 102 of the metal substrate 100 is removed. This may be done according to any of the techniques disclosed herein. As a result, each of the metal posts 104 are detached from one another and second ends of the metal posts 104 are exposed at the first surface 109 of the encapsulant body 110. The removal of the base section 102 additionally exposes the vertical connectors 105 and the layer of adhesive 107 at the first surface 109 of the encapsulant body 110.

Figures 13, 13D, 13E, 13F:
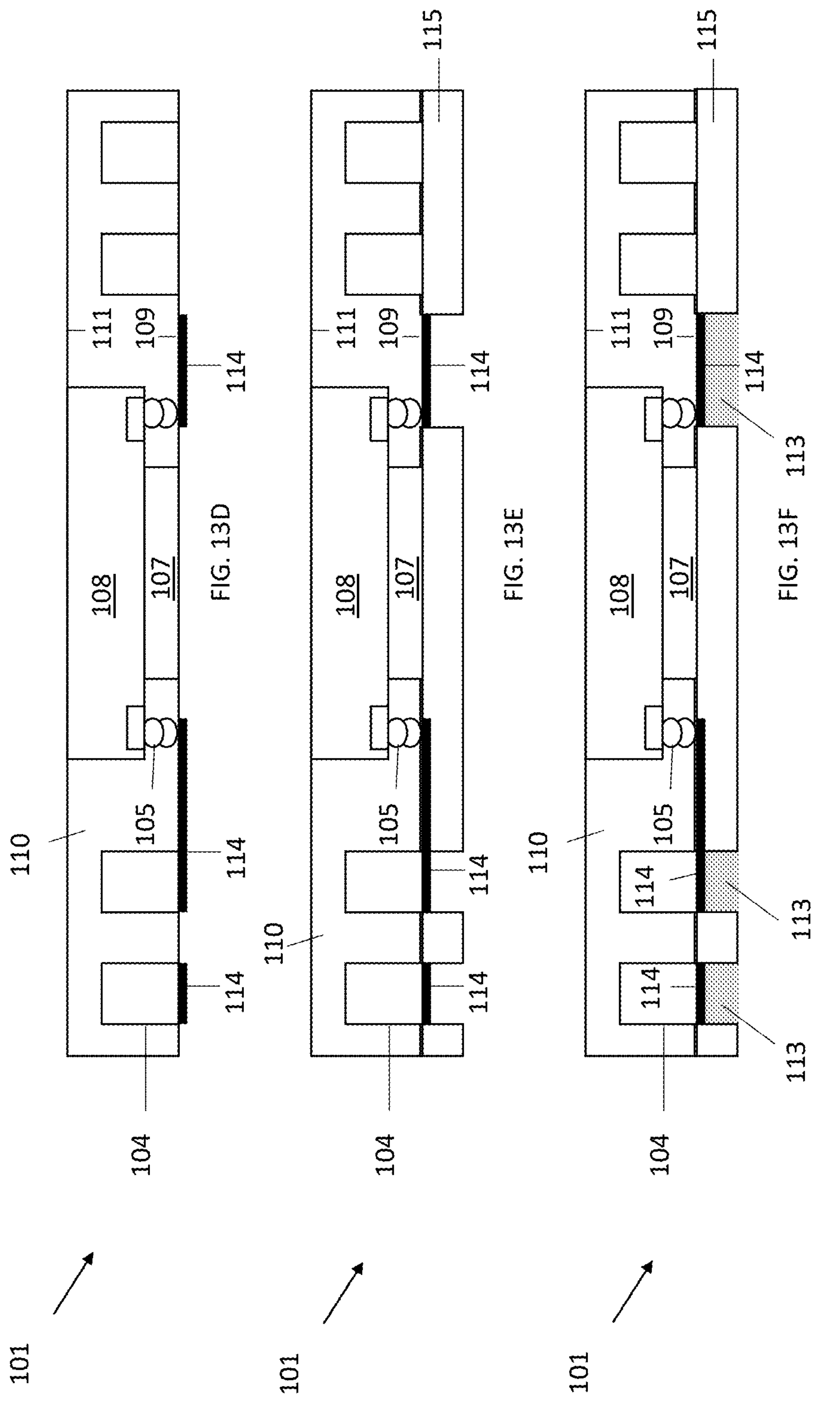

Referring to FIG. 13D, conductive tracks 114 are formed at the first surface 109 of the encapsulant body 110. The conductive tracks 114 may be formed according to any of the techniques disclosed herein. According to an embodiment, the electrically insulating mold compound of the encapsulant body 110 comprises a laser-activatable mold compound, and the conductive tracks 114 are formed by applying a laser to the laser-activatable mold compound to activate the laser-activatable mold compound in selected regions and performing a metal plating process to deposit metal in the selected regions, e.g., in the manner described with reference to FIGS. 1F-1G. According to an embodiment wherein the laser-activatable mold compound is used, the metal plating process comprises forming a lower layer of the conductive tracks by an electroless plating process and forming an upper layer of the conductive tracks on the lower layer by an electroplating process, e.g., in the manner described with reference to FIGS. 1F-1G.

The conductive tracks 114 are formed to contact the ends of the vertical connectors 105 that are exposed at the first surface 109 of the encapsulant body 110, thus forming an electrical connection with the terminals of the semiconductor die 108. According to an embodiment, at least some of the conductive tracks 114 are formed to extend over the second ends of the metal posts 104 that are exposed at the first surface 109 of the encapsulant body 110, e.g., as shown on the left side of the figure. Separately or in combination, at least some of the conductive tracks 114 are formed to terminate without reaching the any of the metal posts 104. These conductive tracks 114 may be used to form contact pads 113 that overlaps with one of the terminals of the semiconductor die 108, as will be described in further detail below.

Referring to FIG. 13E, an electrically insulating layer 115 is formed at the first surface 109 of the encapsulant body 110. The electrically insulating layer 115 can comprise any material that provides electrical isolation and/or protection. For example, the electrically insulating layer 115 can comprise plastics, resins, poylmers, and in particular may comprise a solder resist layer such as a lacquer, epoxy, liquid photoimageable solder mask, dry-film photoimageable solder mask, etc. The electrically insulating layer 115 covers the first surface 109 of the encapsulant body 110 and covers portions of the conductive tracks 114, with the remaining portions of the conductive tracks 114 being exposed from the electrically insulating layer 115. The electrically insulating layer 115 can be formed as a blanket layer and subsequently etched to form the openings. Alternatively, the electrically insulating layer 115 can be formed initially with the openings. The openings in the electrically insulating layer 115 are formed in the locations of the contact pads 113 to be described in further detail below.

Referring to FIG. 13E, contact pads 113 are formed on the conductive tracks 114. The contact pads 113 are formed to be externally accessible at a first side 117 of the semiconductor package that is opposite from the second surface 111 of the encapsulant body 110. The contact pads 113 are electrically connected to the terminals of the semiconductor package the vertical connectors 105 and the conductive tracks 114. At least some of the contact pads 113 may be formed to overlap with the conductive tracks 114 and the second ends of the metal posts 104, e.g., as shown in the left side of the figure. These contact pads 113 may correspond to I/O terminals and may have a similar arrangement as the previously described embodiments. At least some of the contact pads 113 may be formed to overlap with one of the terminals of the semiconductor die, e.g., as shown in the right side of the figure. These contact pads 113 may correspond to terminals requiring low electrical resistance and/or increased thermal capacity, e.g., power supply terminals.

The contact pads 113 can be formed according to any of the metal deposition techniques described herein including electroless plating techniques and/or electroplating techniques. According to an embodiment, the contact pads 113 are formed to comprise a solderable metal. A solderable metal refers to a metal that can form a soldered joint with a metal surface. For instance, a solderable metal may comprise solder material alloys comprising, e.g., Sn, Pb, Ag, Cu, Mn, Bi, etc. In one particular example, the contact pads 113 comprise an alloy of so-called EniG (Electroless nickel immersion gold) and Sn, which forms a tin-alloy solder. In an embodiment, the conductive tracks 114 are formed to comprise a harder and low electrical resistance metal such as copper or alloys thereof, and the contact pads 113 are formed thereon to comprise a solderable metal, e.g., any of the above-mentioned material, thereby providing a combination low-resistance electrical connectivity and solderability.

Figure 14:
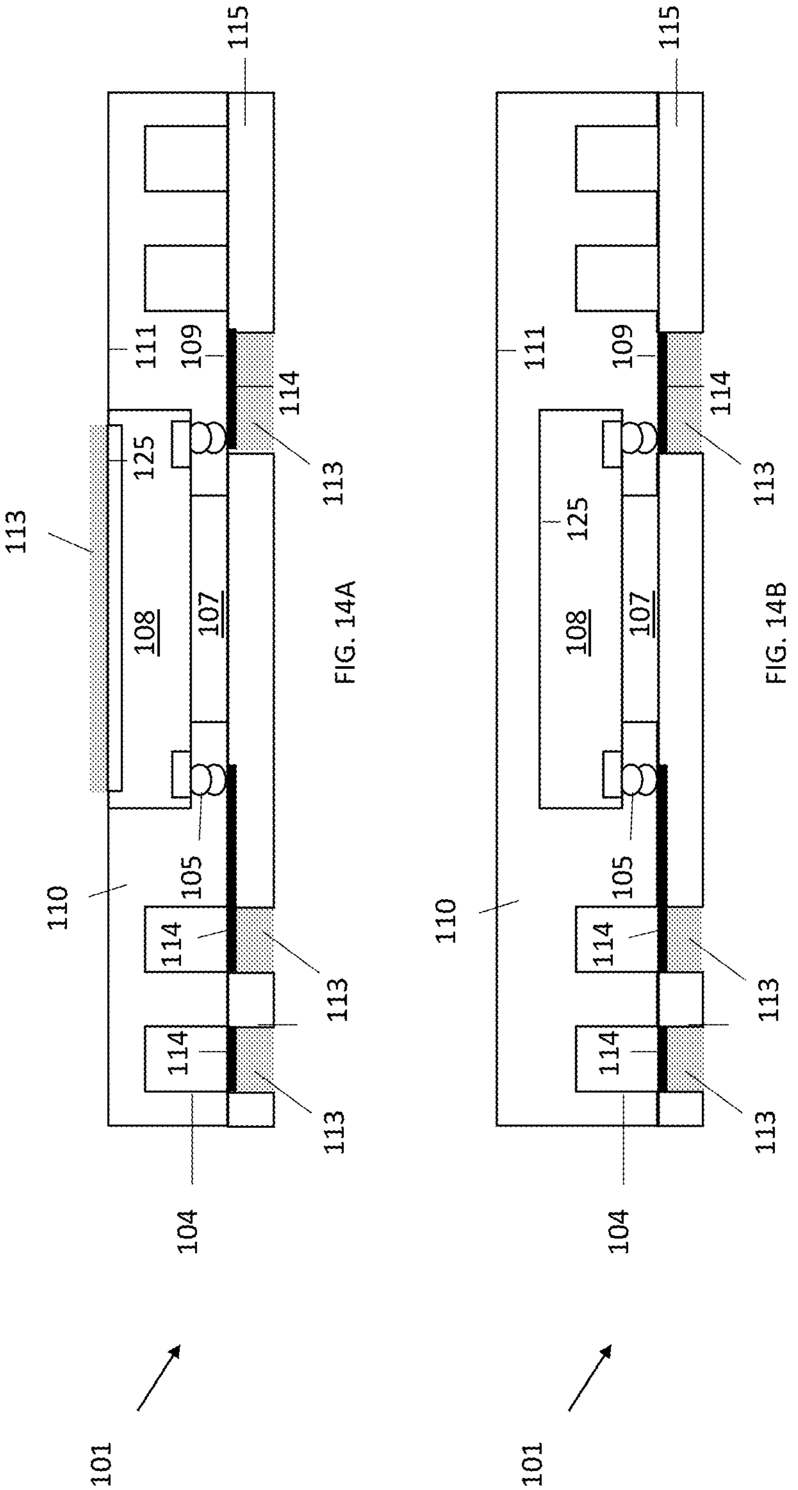
FIG. 14, which includes

Referring to FIG. 14, embodiments of a semiconductor package 101 that may be formed according to the techniques described with reference to FIG. 13 are shown. In the embodiment of FIG. 14A, the rear surface 125 of the semiconductor die 108 is exposed at the second surface 111 of the encapsulant body 110. In this example, the semiconductor die 108 may be configured as a vertical device that comprises a rear side terminal on the rear surface 125 of the semiconductor die 108 that is exposed second side of the encapsulant body 110. The rear side terminal of the semiconductor die 108 can be a load terminal of a vertical device, such as a drain or source terminal in the case of a MOSFET, anode or collector terminal in the case of an IGBT, and so forth. As shown, the semiconductor package 101 can comprise an additional contact pad 113 formed on the rear surface 125 of the semiconductor die 108, thereby providing electrical access to the rear side terminal. Alternatively, this contact pad can be omitted such that the rear side terminal of the semiconductor die 108 is directly exposed. In the embodiment of FIG. 14B, the rear surface 125 of the semiconductor die 108 is spaced apart from the second surface 111 of the encapsulant body 110 and is covered by the mold compound. In this example, the semiconductor die 108 can be configured as a lateral device.

Figures 15, 15A, 15B, 15C:
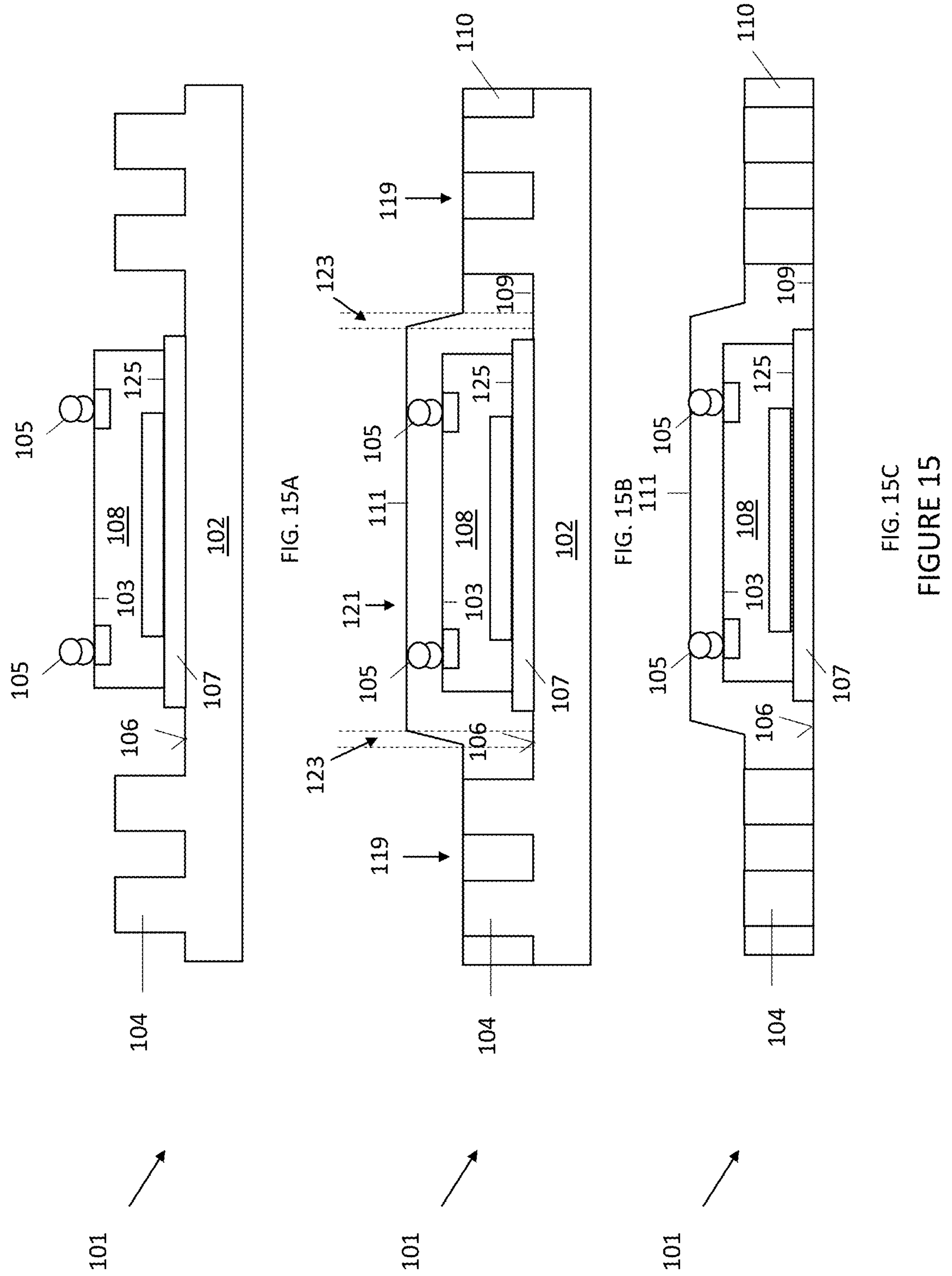
Figure 15:
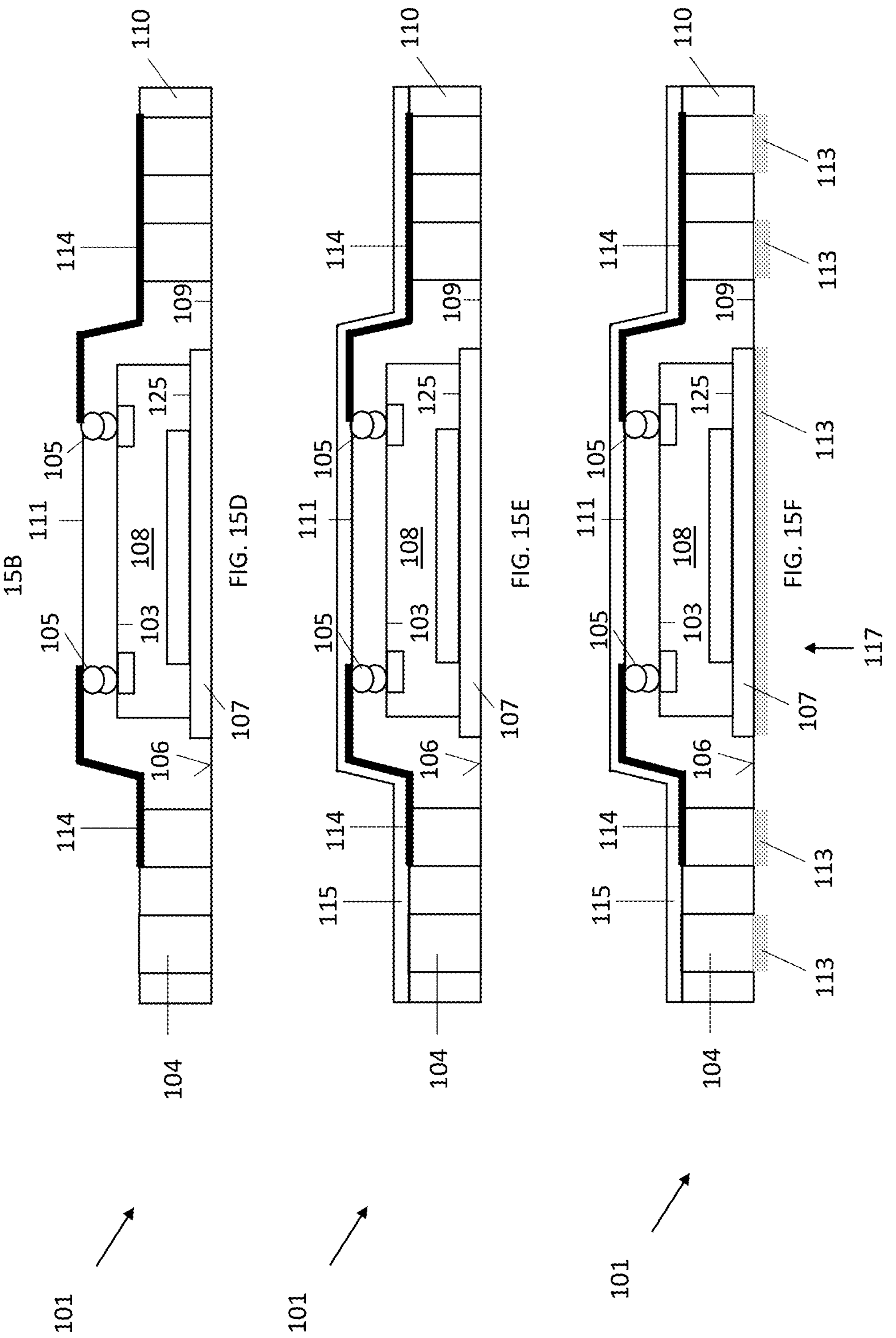
FIG. 15, which includes

Referring to FIG. 15, a method for forming the semiconductor package 101 is shown, according to another embodiment. Similar to the technique described with reference to FIG. 13, the method of claim 15 may be used to accommodate a semiconductor die 108 with a greater thickness than the metal posts 104 of the baseplate when mounted on the baseplate. Different to the technique described with reference to FIG. 13, the method of claim 15 does not involve flip-chip mounting of the semiconductor die 108 and utilizes the metal posts 104 as vertical interconnection structures in a similar manner as described in the previous embodiments.

Referring to FIG. 15A, a semiconductor die 108 is mounted on the upper surface 106 of the base section 102. The semiconductor die 108 is mounted such that a main surface 103 of the semiconductor die 108 that comprises terminals faces away from the metal baseplate 100. As shown, the semiconductor die 108 is mounted to comprise vertical connectors 105 disposed on the main surface 103 of the semiconductor die 108 in contact with the terminals of the semiconductor die 108. The vertical connectors 105 can be provided with the semiconductor die 108 or can be formed on the main surface 103 of the semiconductor die 108 after the mounting of the semiconductor die 108. The semiconductor die 108 is mounted with a rear surface 125 of the semiconductor die 108 facing the metal baseplate 100. The rear surface 125 of the semiconductor die 108 may be affixed to the upper surface 106 of the base section 102 by a layer of adhesive 107. The layer of adhesive 107 can be an electrically conductive adhesive, such as a solder paste or sinter paste. The rear surface 125 of the semiconductor die 108 can comprise a rear side terminal that is electrically contacted by the layer of adhesive 107. The layer of adhesive 107 can be a load terminal of a vertical device, such as a drain or source terminal in the case of a MOSFET, anode or collector terminal in the case of an IGBT, and so forth.

According to an embodiment, the thickness of the semiconductor die 108 exceeds a height of the metal posts 104. The thickness of the semiconductor die 108 may be between 200 μm and 500 μm, or more particularly between 300 μm and 400 μm, or more particularly between 225 μm and 275 μm. The height of the metal posts 104 may between 100 μm and 300 μm, or more particularly between 150 μm and 250 μm, or more particularly between 175 μm and 225 μm. In an embodiment, the thickness of the semiconductor die is at least 250 μm and the height of the metal posts is no greater than 200 μm. Separately or in combination, the main surface 103 of the semiconductor die 108 may be disposed further away from the upper surface 106 of the metal baseplate 100 than the first ends of the metal posts 104 that face away from the metal baseplate 100. This may result from the thickness of the semiconductor die 108 being greater than the height of the metal posts 104 and/or the additional vertical offset provided by the layer of adhesive 107.

Referring to FIG. 15B, the encapsulant body 110 is formed on the metal baseplate 100. The encapsulant body 110 is formed to comprise a first surface 109 that is coextensive with the planar upper surface 106 of the baseplate and a second surface 111 that is opposite from the first surface 109. The encapsulant body 110 is formed such that first ends of the metal posts 104 that face away from the baseplate are exposed from the second surface 111 of the encapsulant body 110 and such that the main surface 103 of the semiconductor die 108 faces the second surface 111 and is covered by the mold compound. This arrangement can be realized by a multi-thickness encapsulant body 110 whereby the second surface 111 extends along different planes. In more detail, the encapsulant body 110 is formed to comprise an outer region 119 that surrounds a central region 121. The thickness of the encapsulant body 110 as measured between the first surface 109 and the second surface 111 is greater in the central region 121 than in the outer region 119. The second surface 111 of the encapsulant body 110 extends along a first plane in the outer region 119, extends along a second plane that is vertically offset from the first plane in the central region 121, and extends along a third plane that is transverse to the first and second planes in a transition region 123 between the central region 121 and the outer region 119. The metal posts 104 are arranged within the outer region 119 and the semiconductor die 108 is arranged within the central region 121 of the encapsulant body 110. The first ends of the metal posts 104 that face away from the metal baseplate 100 are exposed from the second surface 111 of the encapsulant body 110 in the outer region 119. Meanwhile, the vertical connectors 105 are exposed from the second surface 111 of the encapsulant body 110 in the central region 121.

The encapsulant body 110 of FIG. 15 can be formed according to different techniques. According to one technique, a first molding step is performed to encapsulate the metal posts 104 and partially encapsulate the semiconductor die 108 with the mold compound. According to this step, the encapsulant body 110 is formed with a single thickness corresponding to the thickness of the outer region 119. This encapsulant body 110 can be formed to extend to the first ends of the metal posts 104 with the semiconductor die 108 being partially exposed from the encapsulant material in the central region 121. Subsequently, a second molding step may be performed to cover the semiconductor die 108 in the central region 121 with the with the mold compound, thereby forming the thicker section and the multi-face arrangement of the encapsulant body 110. According to another technique, the encapsulant body 110 is formed with a uniform thickness corresponding to the thicker central region 121, with the first ends of the metal posts 104 being covered by the encapsulant material in the outer region 119. Subsequently, the encapsulant material is partially removed from the outer region 119 to locally thin the encapsulant body 110. The encapsulant may be removed by a mechanical technique, e.g., polishing, grinding, etc., or by a chemical technique, e.g., etching. In any case, the encapsulant material is removed to expose the first ends of the metal posts 104 in the outer region 119 and thus create the depicted multi-thickness and multi-face profile.

Referring to FIG. 15C, the base section 102 is removed. This may be done according to any of the techniques described herein. As a result, each of the metal posts 104 are detached from one another. Moreover, the second ends of the metal posts 104 are and the adhesive layer 107 are exposed at the first surface 109 of the encapsulant body 110.

Referring to FIG. 15D, conductive tracks 114 are formed in the second surface 111 of the encapsulant body 110. The conductive tracks 114 are formed to extend from the central region 121 and across the transition region 123 to reach the metal posts 104 in the outer region 119. The conductive tracks 114 contact the vertical connectors 105 and the exposed ends of the metal posts 104 thereby electrically connecting the terminals of the semiconductor die 108 to the metal posts 104. The conductive tracks 114 can be formed according to any of the techniques described herein. According to an embodiment, the mold compound of the encapsulant body 110 comprises a laser-activatable mold compound, and the conductive tracks 114 are formed by applying a laser to the laser-activatable mold compound to activate the laser-activatable mold compound in selected regions and performing a metal plating process to deposit metal in the selected regions, e.g., in the manner described with reference to FIGS. 1 F-1 G. According to an embodiment wherein the laser-activatable mold compound is used, the metal plating process comprises forming a lower layer of the conductive tracks by an electroless plating process and forming an upper layer of the conductive tracks on the lower layer by an electroplating process, e.g., in the manner described with reference to FIGS. 1F-1G.

Referring to FIG. 15E, an electrically insulating layer 115 is formed on the second surface 111 of the encapsulant body 110. The electrically insulating layer 115 can comprise any material that provides electrical isolation and/or protection. For example, the electrically insulating layer 115 can comprise plastics, resins, poylmers, and in particular may comprise a solder resist layer such as a lacquer, epoxy, liquid photoimageable solder mask, dry-film photoimageable solder mask, etc. In this case, the electrically insulating layer 115 can be formed as a blanket layer that completely covers one side of the semiconductor package 101.

Referring to FIG. 15F, contact pads 113 are formed on the semiconductor package 101. The contact pads 113 are formed to be externally accessible at a first side 117 of the semiconductor package 101 that is opposite from the second surface 111 of the encapsulant body 110. At least some of the contact pads 113 may be formed on the exposed second ends of the metal posts 104, and thus overlap with the metal posts 104. These contact pads 113 are electrically connected to the terminals of the semiconductor package 101 via the metal posts 104, the vertical connectors 105 and the conductive tracks 114. As shown, one of the contact pads 113 may be formed to overlap an exposed terminal of the semiconductor die 108. In particular, the semiconductor package 101 comprises a central contact pad 113 that is formed on the adhesive layer 107 and thus forms a point of electrical connection to the rear side terminal of the semiconductor die 108.

Referring to FIGS. 16-20, embodiments of a method for forming a semiconductor package 101 are shown and a corresponding semiconductor package 101 are shown. In these embodiments, a metal baseplate 100 comprising a base section 102 and a plurality of metal posts 104 is provided. The base section 102 is planar pad of substantially uniform thickness. The plurality of metal posts 104 each extend up from a planar upper surface 106 of the base section 102. A first semiconductor die 108 is mounted on the upper surface 106 of the base section 102 in a flip chip arrangement. A first molding process is performed form a first encapsulant body 110 of electrically insulating mold compound on the metal baseplate 100 that encapsulates the first semiconductor die 108 and comprises a first surface 109 and a second surface 111 opposite the first surface 109. The base section 102 is removed thereby detaching the metal posts 104 from one another and exposing the metal posts 104 at the first surface 109 of the first encapsulant body 110. Conductive tracks 114 are formed in the first surface 109 of the first encapsulant body 110 that electrically connect terminals of the first semiconductor die 108 with the metal posts 104. A second semiconductor die 108 is mounted over the first surface 109 or the second surface 111 of the first encapsulant body 110. A second molding process is performed to form a second encapsulant body 110 of electrically insulating mold compound that encapsulates the second semiconductor die 108.

The embodiments of FIGS. 16-20 allow for a multi-chip package configuration that is advantageously space-efficient, with two or more semiconductor dies 108 packaged together in a completely overlapping or partially overlapping arrangement. As will be demonstrated below, the orientation of the semiconductor dies 108 can be such that the terminals face one another or face away form one another. In either case, the conductive tracks 114 can be used to provide electrical interconnect between at least some of the terminals form the semiconductor dies 108 and the metal posts and/or to provide direct interconnect between two or more of the semiconductor dies 108. The first semiconductor die 108 that is mounted of the metal baseplate 100 and the second semiconductor die 108 or dies 108 that are mounted on the first encapsulant body 110 can have any configuration of the semiconductor dies 108 disclosed herein. In one embodiment, both of the first and second semiconductor dies 108 are configured as power transistor dies. More particularly, the first semiconductor die 108 and the second semiconductor die 108 can be arranged as the high-side and low-side switch of a half-bridge circuit or vice-versa, wherein the electrical interconnections connect the load terminals of these two devices together. In another embodiment, one of the first semiconductor die 108 and the second semiconductor die 108 is a power transistor die, and the other one of the first semiconductor die 108 and the second semiconductor die 108 is a driver die configured to control a switching operation of the power transistor die.

Figures 16, 16A, 16B, 16C:
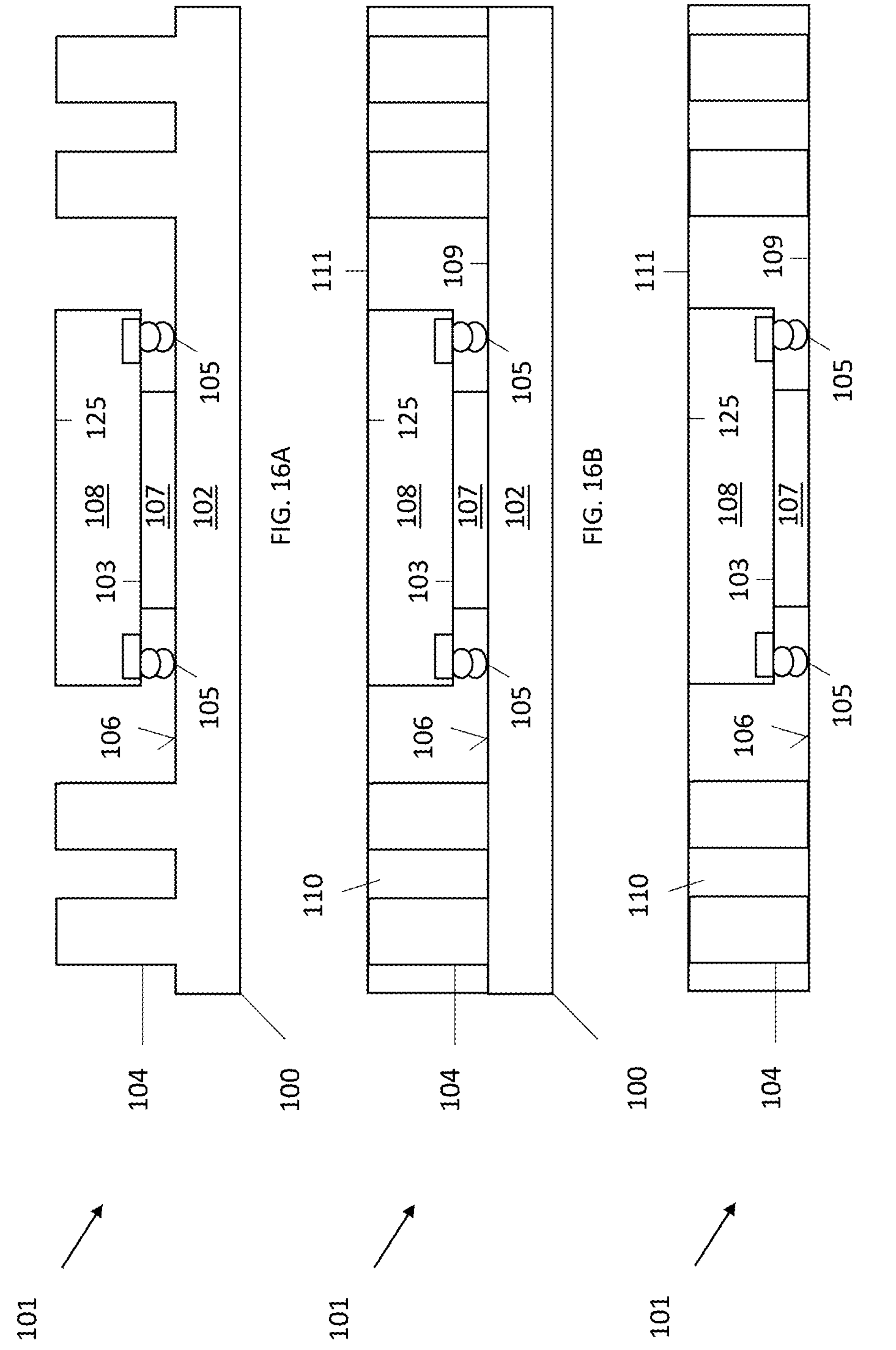
FIG. 16, which includes
FIGS. 16A-16F, illustrates selected steps in a method of forming a semiconductor package, according to an embodiment.

Referring to FIG. 16A, the metal baseplate 100 comprising the base section 102 and a plurality of metal posts 104 is provided. A first semiconductor die 108 is mounted on the upper surface of the base section 102. The first semiconductor die 108 is mounted in a flip chip arrangement wherein a main surface 103 of the first semiconductor die 108 that comprises terminals faces the metal baseplate 100. Vertical connectors 105 are provided between the terminals of the first semiconductor die 108 and the metal baseplate 100. The vertical connectors 105 can be soler balls, pillars, studs, etc. The vertical connectors 105 can be provided on the upper surface 106 of the baseplate 100 prior to mounting the first semiconductor die 108 and the first semiconductor die 108 can be subsequently arranged thereon. Alternatively, the vertical connectors 105 can be initially provided on the main surface 103 of the first semiconductor die 108 and then the first semiconductor die 108 can be mounted on the upper surface 106 of the baseplate 100. As shown, the layer of adhesive 107 may be provided between the main surface 103 of the semiconductor die 108 and the upper surface 106 of the base section 102 as well.

Referring to FIG. 16B, a first molding process is performed. The first molding process forms a first encapsulant body 110 of electrically insulating mold compound on the metal baseplate 100 that encapsulates the first semiconductor die 108. The first encapsulant body 110 can be formed according to any of the previously described techniques and may comprise any of the encapsulant materials as described above. According to an embodiment, the first encapsulant body 110 comprises a plateable mold compound such as a laser-activatable mold compound. The first encapsulant body 110 comprises a first surface 109 and a second surface 111. The first surface 109 is coextensive with the planar upper surface 106 of the baseplate 100. The second surface 111 is opposite from the first surface 109. As shown, the second surface 111 is formed such that ends of the metal posts 104 are exposed from the first encapsulant body 110. This may be done by initially forming the first encapsulant body 110 to cover the ends of the metal posts 104 and subsequently removing encapsulant material, e.g., by etching, grinding, etc. Alternatively, this may be done directly form the molding process used to form the first encapsulant body 110.

Referring to FIG. 16C, the base section 102 of the metal substrate 100 is removed. This may be done according to any of the techniques disclosed herein. As a result, each of the metal posts 104 are detached from one another and ends of the metal posts 104 are exposed at the first surface 109 of the encapsulant body 110. The removal of the base section 102 additionally exposes the vertical connectors 105 and the layer of adhesive 107 at the first surface 109 of the encapsulant body 110.

Figures 16, 16D, 16E, 16F:
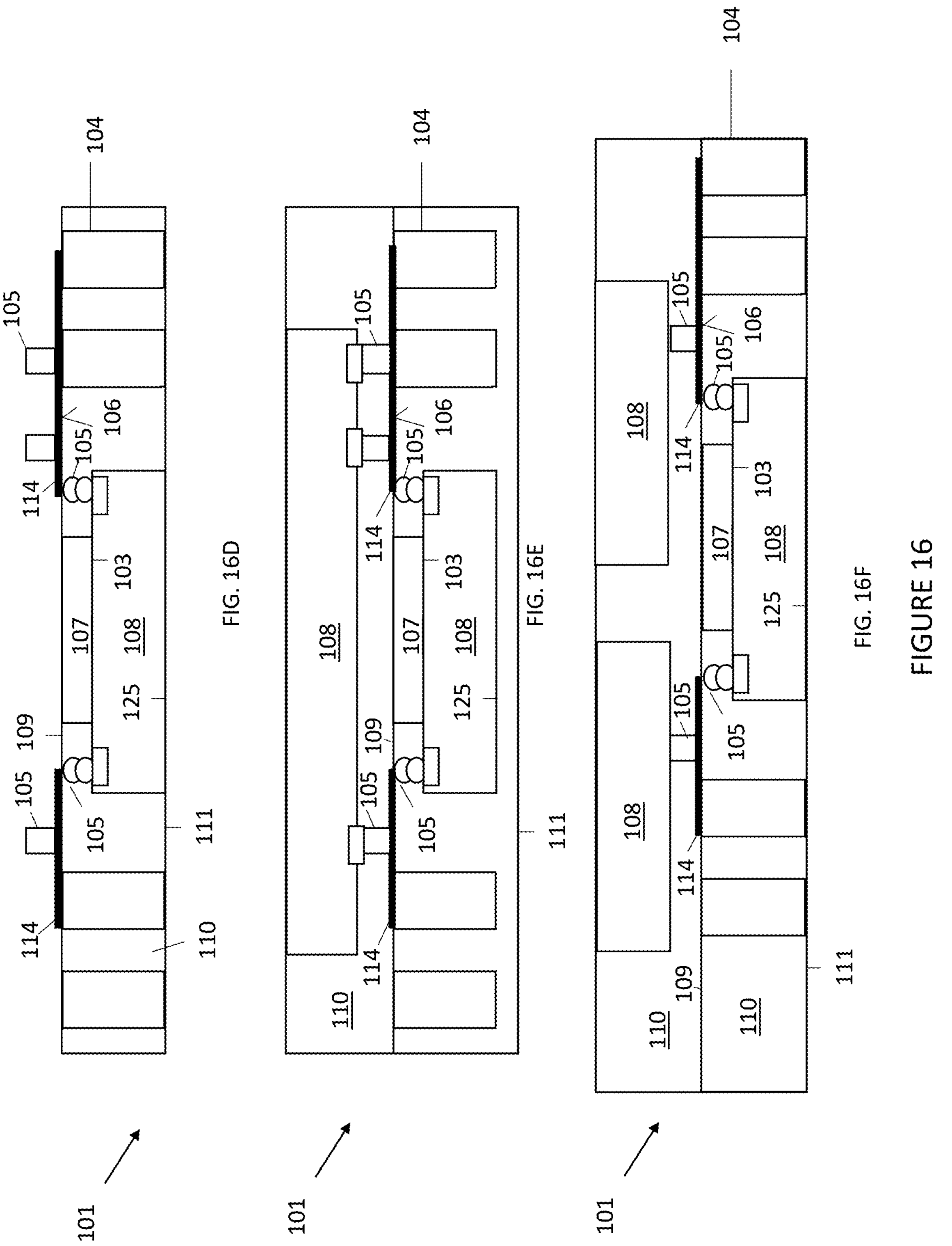

Referring to FIG. 16D, the first encapsulant body 110 is arranged such that the first surface 109 of the encapsulant body is available to perform processing thereon. As shown, the arrangement is flipped upside down in comparison to FIG. 16C. In practice, a physical flipping of the first encapsulant body 110 may be performed. Conductive tracks 114 are formed in the first surface 109 of the encapsulant body 110, e.g., according to any of the techniques disclosed herein. Some of the conductive tracks 114 electrically connect the terminals of the first semiconductor die 108 with the metal posts 104. A second group of the conductive tracks 114 is used to electrically connect the second semiconductor die 108 (shown in FIG. 16E) to the metal posts 104, the terminals of the first semiconductor die 108, or both. The second group of the conductive tracks 114 can be electrically connected to the metal posts 104, the terminals of the first semiconductor die 108, or both. Vertical connectors 105 are formed on the second group of conductive tracks 114 to facilitate a flip-chip connection. Optionally, bond pad regions (not seen from the perspective of FIG. 16D) that are wider than other parts of the second conductive tracks 114 can be formed facilitate the placement of the vertical connectors 105 and the mounting of the second semiconductor die 108. These bond pad regions may be part of the conductive tracks 114 or separate conductive structures that are in contact with the conductive tracks 114.

Referring to FIG. 16E, a second semiconductor die 108 is mounted over the first surface 109 of the first encapsulant body 110. The second semiconductor die 108 is mounted in a flip chip arrangement wherein a main surface of the second semiconductor die 108 that comprises terminals faces the first surface 109 of the first encapsulant body 110. The vertical connectors form electrical connections between the terminals of the second semiconductor die 108 and the second group of conductive tracks 114. As a result, the terminals of the second semiconductor die 108 are electrically connected to the metal posts 104. Separately or in combination, the various terminals of the second semiconductor die 108 can be electrically connected with the terminals of the first semiconductor die 108 via the second group of conductive tracks 114.

In the embodiment of FIG. 16E, the second semiconductor die 108 is centered relative to the first semiconductor die 108, meaning that a center point between two edge sides of the second semiconductor die 108 is directly over and aligned with a center point between two edge sides of the first semiconductor die 108. Thus, the first and second semiconductor dies 108 are in an overlapping arrangement. In an embodiment, the first and second semiconductor dies 108 may be completely centered with one another, meaning that centroids of the two dies directly align with one another. As shown, the second semiconductor die 108 is larger than the first semiconductor die 108 such that the outer periphery of the second semiconductor die 108 is outside of the outer periphery of the first semiconductor die 108. In other embodiments, the second semiconductor die 108 may be smaller or the same size as the first semiconductor die 108.

After mounting the second semiconductor die 108, a second molding process is performed to form a second encapsulant body 110 of electrically insulating mold compound that encapsulates the second semiconductor die 108. The second encapsulant body 110 can be formed according to any of the previously described techniques and may comprise any of the encapsulant materials as described above. The second encapsulant body 110 can be formed by the same process and/or comprise the same material as the first encapsulant body 110 previously formed. However, the second encapsulant body 110 does not necessarily require plateable mold compound, as each of the electrical connections may be provided by the previously formed conductive tracks 114.

Referring to FIG. 16F, an alternate arrangement for mounting the second semiconductor die 108 over the first surface 109 of the first encapsulant body 110 is shown.

FIG. 16F may be substituted for FIG. 16E as a potential option after performing the processes described with reference to FIG. 16D. In the embodiment of FIG. 16F, two of the second semiconductor dies 108 are mounted off-center relative to the first semiconductor die 108, meaning that center points between two edge sides of the second semiconductor dies 108 are laterally offset from a center point between two edge sides of the first semiconductor dies 108. This off-center arrangement can be used to improve space efficiency and/or provide more area for the provision of multiple elements over the first encapsulant body 110, such as multiple semiconductor dies (as shown) and/or passive devices.

Figures 17, 17A, 17B, 17C:
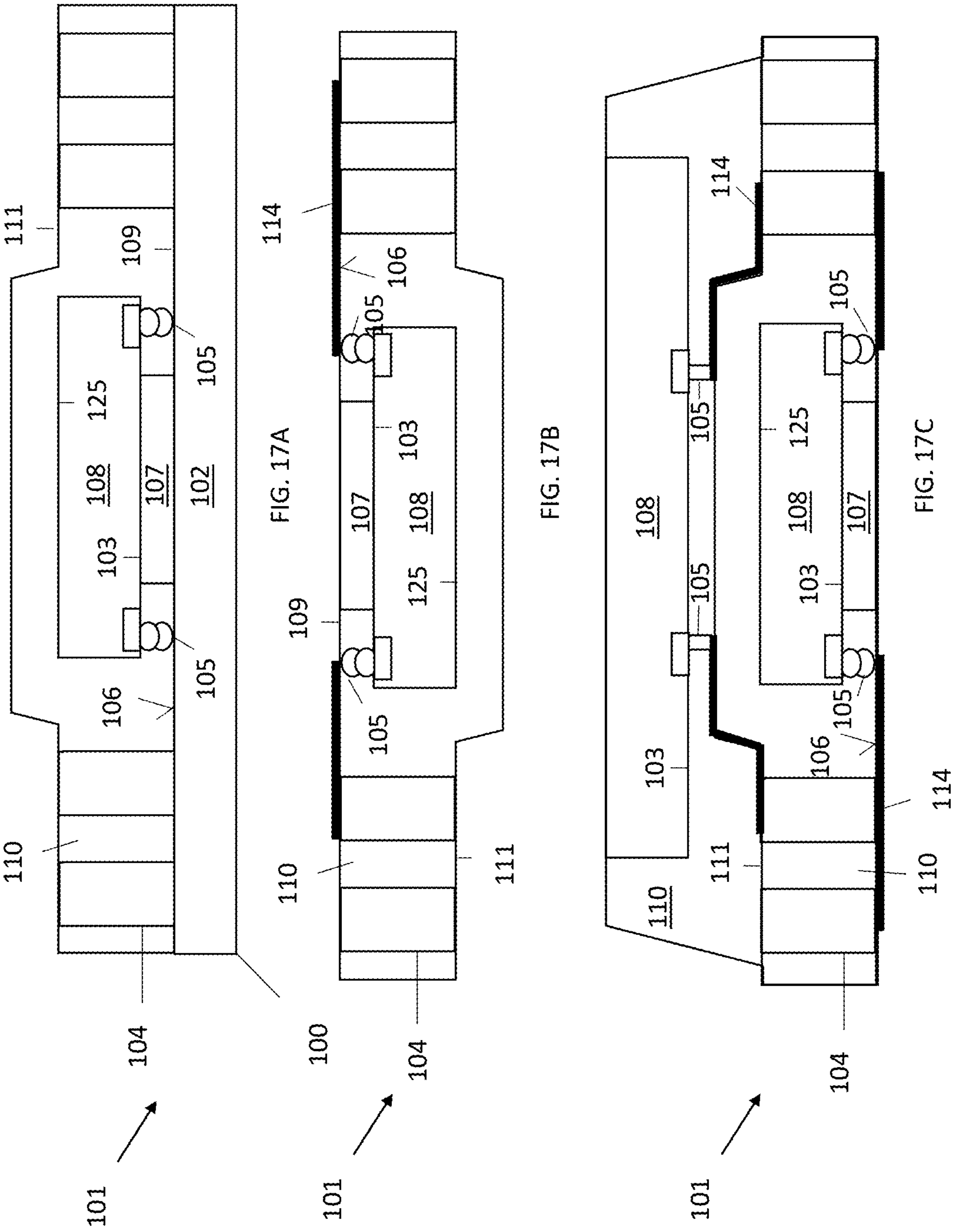
FIG. 17, which includes
FIGS. 17A-17C, illustrates selected steps in a method of forming a semiconductor package, according to an embodiment.

FIG. 17 comprising FIGS. 17A-17C illustrate selected method steps for forming a multi-chip semiconductor package 101, according to another embodiment.

Referring to FIG. 17A, method steps akin to those described with reference to FIGS. 16A and 16B are performed, with the following difference. The first encapsulant body 110 is formed such that the rear surface 125 of the first semiconductor die 108 is covered by encapsulant material. This may be done by forming the first encapsulant body 110 to have a multi-thickness configuration, e.g., according to the same techniques described with reference to FIG. 15.

Referring to FIG. 17B, the base section 102 of the metal substrate 100 is removed. Subsequently, the arrangement comprising the first semiconductor die 108 encapsulated by the first encapsulant body 110 is arranged such that the first surface 109 of the first encapsulant body 110 is available to perform processing thereon. The conductive tracks 114 are formed at the first surface 109 of the encapsulant body 110, thereby electrically connecting the terminals of the first semiconductor die 108 with the metal posts 104.

Referring to FIG. 17C, the first encapsulant body 110 is arranged such that the second surface 111 of the first encapsulant body 110 is available to perform processing thereon. As shown, the arrangement is flipped upside down in comparison to FIG. 17B. In practice, a physical flipping of the first encapsulant body 110 may be performed. Conductive tracks 114 are formed in the second surface 111 of the first encapsulant body 110. The conductive tracks 114 may be formed according to any of the techniques disclosed herein. The conductive tracks 114 are formed to extend from a central die attach region of the first encapsulant body 110 to the ends of the metal posts 104 that are exposed from the first encapsulant body 110. Vertical connectors 105 are formed on the conductive tracks 114. Subsequently, the second semiconductor die 108 is mounted over the second surface 111 of the first encapsulant body 110. The second semiconductor die 108 is mounted in a flip chip arrangement wherein a main surface 103 of the second semiconductor die 108 that comprises terminals faces the second surface 111 of the first encapsulant body 110. The conductive tracks 114 in the second surface 111 of the first encapsulant body 110 electrically connect the terminals of the second semiconductor die 108 with the metal posts 104. Subsequently, the second encapsulant body 110 is formed to encapsulate the second semiconductor die 108.

Figure 18:
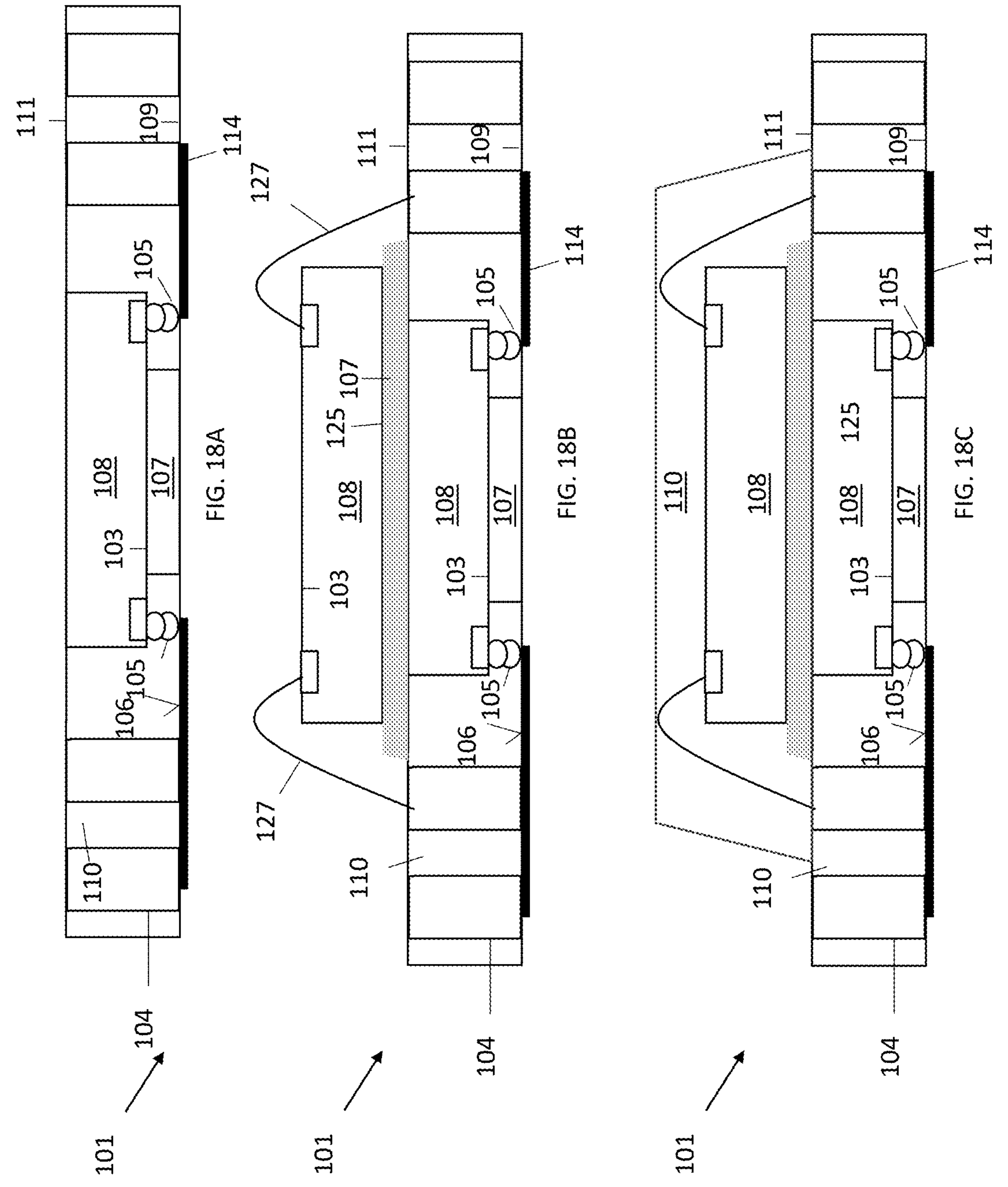
FIG. 18, which includes

FIG. 18 comprising FIGS. 18A-18C illustrate selected method steps for forming a multi-chip semiconductor package 101, according to another embodiment.

Referring to FIG. 18A, method steps akin to those described with reference to FIGS. 16A and 16B are performed to provide the first semiconductor die 108 with the first encapsulant body 110 and the conductive tracks 114 on the first surface 109 of the first encapsulant body 110. Subsequently, the first encapsulant body 110 is arranged such that the second surface 111 of the first encapsulant body 110 is available to perform processing thereon.

Referring to FIG. 18B, the second semiconductor die 108 is mounted over the second surface 111 of the first encapsulant body 110. In this example, the second semiconductor die 108 is mounted in a face-up arrangement with wherein a main surface 103 of the second semiconductor die 108 that comprises terminals faces away from the second surface 111 of the first encapsulant body 110. The rear surface 125 of the second semiconductor die 108 is attached to the second surface 111 of the first encapsulant body 110 by a region of adhesive material 107, which may be a solder, sinter, glue or tape, for example. The terminals of the second semiconductor die 108 are electrically connected to the metal posts 104 by providing electrical interconnect elements 127 that extend from the terminals of the second semiconductor die 108 to the exposed ends of the metal posts 104. The electrical interconnect elements 127 can be any type of electrical interconnect element such as a bond wire (as shown), metal clip, ribbon, etc.

Referring to FIG. 18C, the second encapsulant body 110 is formed to encapsulate the second semiconductor die 108. As shown, the second encapsulant body 110 may be formed on only a portion of the first encapsulant body 110. This reduces the footprint of the semiconductor package and can leave some of the metal posts 104 to be electrically accessible at the second side 111 of the first encapsulant body 110.

Figures 19, 19A, 19B, 19C:
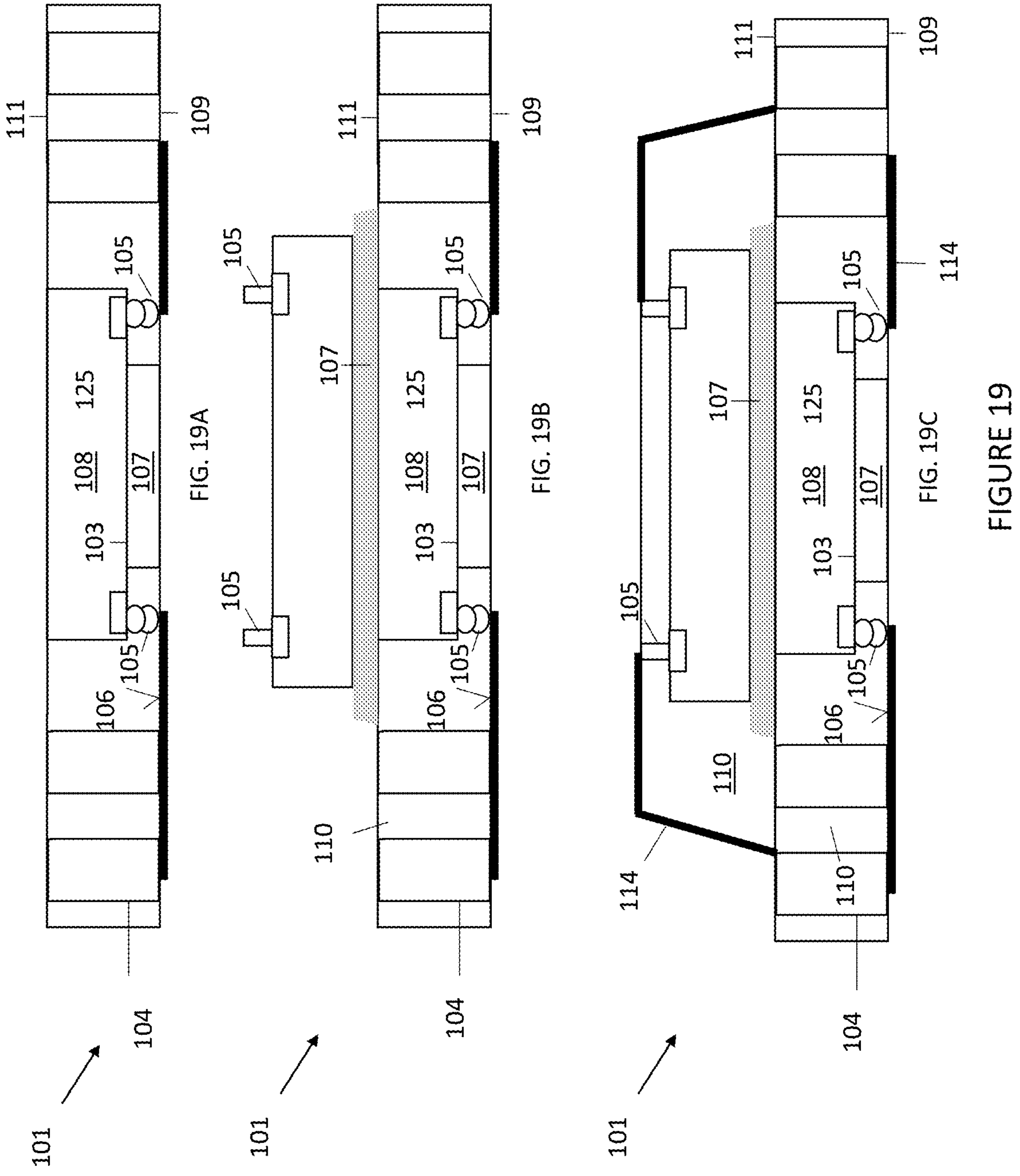
FIG. 19, which includes
FIGS. 19A-19C, illustrates selected steps in a method of forming a semiconductor package, according to an embodiment.

FIG. 19 comprising FIGS. 19A-19C illustrate selected method steps for forming a multi-chip semiconductor package 101, according to another embodiment.

Referring to FIGS. 19A-19B, a process that is similar to that described with reference to FIGS. 18A-18B is performed, except that the electrical interconnect elements 127 are not provided. Instead, the vertical connectors 105 are formed on the terminals of the second semiconductor die 108.

As shown in FIG. 19C, the second encapsulant body 110 is formed on a portion of the first encapsulant body 110 that is within a central region of the first encapsulant body 110, wherein the central region refers a region of the first encapsulant body 110 that is surrounded by the metal posts 104. That is, the second encapsulant body 110 is formed such that some of the metal posts 104 remain accessible for connection at the side of the semiconductor package 101 that the second encapsulant body 110 is formed on. The terminals of the second semiconductor die 108 are electrically connected with the metal posts 104 by forming conductive tracks 114 in the outer surface of the second encapsulant body 110. According to an embodiment, the conductive tracks 114 are formed along a side surface of the second encapsulant body 110 that is tilted relative to the second surface 111 of the first encapsulant body 110, i.e., the surface that transitions from the second encapsulant body 110 the first encapsulant body 110. In this embodiment, the second encapsulant body 110 can comprise a plateable mold compound and the conductive tracks 114 can be formed by plating techniques as described herein.

The semiconductor package 101 described herein may comprise one or more semiconductor dies 108 with a variety of different configurations. These semiconductor dies 108 may be singulated from a semiconductor wafer (not shown), e.g., by sawing, prior to being mounting on the metal baseplate 100. In general, the semiconductor wafer and therefore the resulting semiconductor die 108 may be made of any semiconductor material suitable for manufacturing a semiconductor device. Examples of such materials include, but are not limited to, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGalnN) or indium gallium arsenide phosphide (InGaAsP), etc. In general, the semiconductor die 108 can be any active or passive electronic component. Examples of these devices include power semiconductor devices, such as power MISFETs (Metal Insulator Semiconductor Field Effect Transistors) power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), power bipolar transistors or power diodes such as, e.g., PIN diodes or Schottky diodes, etc. Other examples of these devices include logic devices, such as microcontrollers, e.g., memory circuits, level shifters, etc. One or more of the semiconductor dies 108 can be configured as a so-called lateral device. In this configuration, the terminals of the semiconductor die 108 are provided on a single main surface and the semiconductor die 108 is configured to conduct in a direction that is parallel to the main surface 103 of the semiconductor die 108. Alternatively, one or more of the semiconductor dies 108 can be configured as a so-called vertical device. In this configuration, the terminals of the semiconductor die 108 are provided on opposite facing main and rear surfaces and the semiconductor die 108 is configured to conduct in a direction that is perpendicular to the main surface 103 of the semiconductor die 108.

The term "electrically connected" as used herein describes a permanent low-ohmic, i.e., low-resistance, connection between electrically connected elements, for example a wire connection between the concerned elements. By contrast, the term "electrically coupled" contemplates a connection in which there is not necessarily a low-resistance connection and/or not necessarily a permanent connection between the coupled elements. For instance, active elements, such as transistors, as well as passive elements, such as inductors, capacitors, diodes, resistors, etc., may electrically couple two elements together.

Spatially relative terms such as "under," "below," "lower," "over," "upper," "main", "rear", and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a semiconductor package, the method comprising:

providing a metal baseplate comprising a base section and a plurality of metal posts, the base section being a planar pad of substantially uniform thickness, the plurality of metal posts each extending up from a planar upper surface of the base section;

mounting a semiconductor die on the upper surface of the base section in a flip chip arrangement wherein a main surface of the semiconductor die that comprises terminals faces the metal baseplate and vertical connectors extend between the terminals and the planar upper surface of the base section;

forming an encapsulant body of electrically insulating mold compound on the metal baseplate that encapsulates the semiconductor die and covers;

removing the base section thereby detaching the metal posts from one another and exposing ends of the vertical connectors at a first surface of the encapsulant body; and forming contact pads at a first side of the semiconductor package that are electrically connected to the terminals of the semiconductor die, wherein the encapsulant body is formed such that first ends of the metal posts that face away from the upper surface of the baseplate are covered by the mold compound.

2. The method of claim 1, wherein mounting the semiconductor die comprises providing a layer of adhesive between the main surface of the semiconductor die and the upper surface of the base section.

3. The method of claim 1, wherein the encapsulant body is formed such that a rear surface of the semiconductor die that is opposite from the main surface of the semiconductor die is exposed at a second surface of the encapsulant body.

4. The method of claim 1, wherein the encapsulant body is formed such that a rear surface of the semiconductor die that is opposite from the main surface of the semiconductor die faces a second surface of the encapsulant body and is covered by the mold compound.

5. The method of claim 1, further comprising forming conductive tracks at the first surface of the encapsulant body that contact outer ends of the vertical connectors, and wherein the contact pads are electrically connected to the terminals of the semiconductor die by the conductive tracks.

6. The method of claim 5, wherein the electrically insulating mold compound comprises a laser-activatable mold compound, wherein forming the conductive tracks comprises applying a laser to the laser-activatable mold compound to activate the laser-activatable mold compound in selected regions and performing a metal plating process to deposit metal in the selected regions.

7. The method of claim 6, wherein performing the metal plating process comprises forming a lower layer of the conductive tracks by an electroless plating process and forming an upper layer of the conductive tracks on the lower layer by an electroplating process.

8. The method of claim 5, wherein the conductive tracks extend over ends of the metal posts, and wherein the contacts pads are formed to overlap with the conductive tracks and the metal posts.

9. The method of claim 8, wherein the conductive tracks are formed from copper, and wherein the contact pads comprise a solderable metal.

10. The method of claim 5, further comprising forming an electrically insulating layer at the first surface of the encapsulant body, wherein the electrically insulating layer covers portions of the conductive tracks and comprises openings, and wherein the contact pads are formed within the openings.

11. A method of forming a semiconductor package, the method comprising:

providing a metal baseplate comprising a base section and a plurality of metal posts, the base section being a planar pad of substantially uniform thickness, the plurality of metal posts each extending up from a planar upper surface of the base section;

mounting a semiconductor die on the upper surface of the base section with a main surface of the semiconductor die comprising terminals facing away from the metal baseplate;

forming an encapsulant body of electrically insulating mold compound on the metal baseplate that encapsulates the semiconductor die;

removing the base section thereby detaching the metal posts from one another and exposing the metal posts at a first surface of the encapsulant body; and electrically connecting the terminals of the semiconductor die to the metal posts, wherein a thickness of the semiconductor die when mounted is greater than a height of the metal posts, the height of the metal posts being a distance between the planar upper surface of the base section and first ends of the metal posts that face away from the baseplate.

12. The method of claim 11, wherein after forming the encapsulant body first ends of the metal posts that face away from the baseplate are exposed from a second surface of the encapsulant body, wherein the main surface of the semiconductor die faces the second surface of the encapsulant body and is covered by the mold compound.

13. The method of claim 12, wherein the metal posts are arranged within an outer region of the encapsulant body and the semiconductor die is arranged within a central region of the encapsulant body, wherein the second surface of the encapsulant body extends along a first plane in the outer region, extends along a second plane that is vertically offset from the first plane in the central region, and extends along a third plane that is transverse to the first and second planes in a transition region between the central region and the outer region.

14. The method of claim 13, further comprising providing vertical connectors on the terminals of the semiconductor die before forming the encapsulant body, wherein the encapsulant body is formed such that the vertical connectors are exposed from the second surface of the encapsulant body in the central region, and wherein electrically connecting the terminals of the semiconductor die to the metal posts comprises forming conductive tracks on the second surface of the encapsulant body that extend from the central region and across the transition region to reach the metal posts in the outer region.

15. The method of claim 14, wherein the electrically insulating mold compound comprises a laser-activatable mold compound, wherein forming the conductive tracks comprises applying a laser to the laser-activatable mold compound to activate the laser-activatable mold compound in selected regions and performing a metal plating process to deposit metal in the selected regions.

16. The method of claim 15, wherein performing the metal plating process comprises forming a lower layer of the conductive tracks by an electroless plating process and forming an upper layer of the conductive tracks on the lower layer by an electroplating process.

17. The method of claim 14, further comprising forming an electrically insulating layer on the second surface of the encapsulant body that covers the conductive tracks.

18. The method of claim 14, wherein, after removing the metal baseplate, second ends of the metal posts are exposed at the first surface of the encapsulant body, and wherein the method further comprises forming contact pads over the second ends of the metal posts.

19. The method of claim 14, wherein the semiconductor die is mounted on the metal baseplate with a layer of adhesive between a rear surface terminal of the semiconductor die and the metal baseplate, wherein after removing the metal baseplate the layer of adhesive is exposed at the first surface of the encapsulant body, and wherein the method further comprises forming a contact pad over the layer of adhesive.

20. The method of claim 11, wherein forming the encapsulant body comprises:

performing a first molding step that that encapsulates the metal posts and partially encapsulates the semiconductor die with the mold compound; and performing a second molding step that covers the main surface of the semiconductor die with the mold compound.

21. The method of claim 11, wherein the thickness of the semiconductor die is at least 200 μm, and wherein the height of each of the metal posts is no more than 250 μm.

* * * * *